(12) United States Patent
Kushida et al.

(10) Patent No.: US 10,680,091 B2
(45) Date of Patent: Jun. 9, 2020

(54) SEMICONDUCTOR DEVICE

(71) Applicants: Toyota Jidosha Kabushiki Kaisha, Toyota-shi, Aichi-ken (JP); Toyota School Foundation, Nagoya-shi, Aichi-ken (JP)

(72) Inventors: Tomoyoshi Kushida, Nisshin (JP); Yoshitaka Nagasato, Toyota (JP); Naotaka Iwata, Nagoya (JP); Hiroyuki Sakaki, Nagoya (JP)

(73) Assignees: Toyota Jidosha Kabushiki Kaisha, Toyota-shi, Aichi-ken (JP); Toyota School Foundation, Nagoya-Shi, Aichi-Ken (JP)

( * ) Notice: Subject to any disclaimer, the term of this patent is extended or adjusted under 35 U.S.C. 154(b) by 0 days.

(21) Appl. No.: 16/229,613

(22) Filed: Dec. 21, 2018

(65) Prior Publication Data
US 2019/0198652 A1 Jun. 27, 2019

(30) Foreign Application Priority Data

Dec. 27, 2017 (JP) .................. 2017-251836
Mar. 8, 2018 (JP) .................. 2018-041714

(51) Int. Cl.
| | |
|---|---|
| *H01L 29/778* | (2006.01) |
| *H01L 29/36* | (2006.01) |
| *H01L 29/423* | (2006.01) |
| *H01L 29/417* | (2006.01) |
| *H01L 29/10* | (2006.01) |
| *H01L 29/08* | (2006.01) |
| *H01L 29/66* | (2006.01) |

(Continued)

(52) U.S. Cl.
CPC ...... *H01L 29/7782* (2013.01); *H01L 29/0649* (2013.01); *H01L 29/0847* (2013.01); *H01L 29/0891* (2013.01); *H01L 29/1066* (2013.01); *H01L 29/365* (2013.01); *H01L 29/41766* (2013.01); *H01L 29/42316* (2013.01); *H01L 29/778* (2013.01); *H01L 29/7789* (2013.01); *H01L 29/20* (2013.01); *H01L 29/2003* (2013.01)

(58) Field of Classification Search
None
See application file for complete search history.

(56) References Cited

U.S. PATENT DOCUMENTS

2014/0091366 A1* 4/2014 Jeon .................. H01L 21/8252
257/195
2018/0219086 A1 8/2018 Higuchi et al.

FOREIGN PATENT DOCUMENTS

| JP | 2015-149360 A | 8/2015 |
| JP | 2017-022323 A | 1/2017 |
| JP | 2017-073526 A | 4/2017 |

OTHER PUBLICATIONS https://en.wikipedia.org/wiki/High-electron-mobility_transistor (Year: 2004).*

* cited by examiner

*Primary Examiner* — Herve-Louis Y Assouman
(74) *Attorney, Agent, or Firm* — Dinsmore & Shohl LLP

(57) ABSTRACT

In a semiconductor device having a heterojunction type superjunction structure, a drain portion and a source portion are electrically connected to one of a two-dimensional electron gas layer and a two-dimensional hole gas layer, and a gate portion is prevented by an insulating region from directly contacting the one of the two-dimensional election gas layer and the two-dimensional hole gas layer.

20 Claims, 13 Drawing Sheets

(51) Int. Cl.
*H01L 29/06* (2006.01)
*H01L 29/20* (2006.01)

SEMICONDUCTOR DEVICE

CROSS-REFERENCE TO RELATED APPLICATIONS

This application claims priority to Japanese Patent Application No. 2018-041714 filed on Mar. 8, 2018, and Japanese Patent Application No. 2017-251836, filed on Dec. 27, 2017, which are incorporated herein by reference in their entirety including the specification, drawings and abstract.

BACKGROUND

1. Technical Field

The technology disclosed in this specification relates to a semiconductor device having a heterojunction type superjunction structure.

2. Description of Related Art

Semiconductor devices having a heterojunction type superjunction structure are disclosed in Japanese Unexamined Patent Application Publication No. 2017-22323 (JP 2017-22323 A) and Japanese Unexamined Patent Application Publication No. 2017-73526 (JP 2017-73526 A). The semiconductor device of this type includes a drain portion, a source portion, and a semiconductor laminated body provided between the drain portion and the source portion. The semiconductor laminated body consists of a plurality of semiconductor layers laminated together, and has a heterojunction that forms a two-dimensional electron gas layer and a heterojunction that forms a two-dimensional hole gas layer. The semiconductor laminated body is configured such that the two-dimensional electron gas layer and the two-dimensional hole gas layer are opposed to each other in the lamination direction. The semiconductor laminated body may be configured such that a pair of two-dimensional electron gas layer and two-dimensional hole gas layer appears repeatedly in the lamination direction. The semiconductor device of this type further includes gate portions that are located between the drain portion and the source portion, and extend through the two-dimensional electron gas layer and two-dimensional hole gas layer of the semiconductor laminated body.

In the semiconductor devices disclosed in JP 2017-22323 A and JP 2017-73526 A, the drain portion and the source portion are comprised of n-type semiconductors, and the gate portion is comprised of a p-type semiconductor. With this arrangement, the two-dimensional electron gas layer of the semiconductor laminated body is in ohmic contact with the drain portion of the n-type semiconductor and the source portion of the n-type semiconductor, and is in contact with the gate portion of the p-type semiconductor via a p-n junction. On the other hand, the two-dimensional hole gas layer of the semiconductor laminated body is in ohmic contact with the gate portion of the p-type semiconductor, and is in contact with the drain portion of the n-type semiconductor and the source portion of the n-type semiconductor via p-n junctions.

In this type of semiconductor device, the two-dimensional electron gas layer extends between the drain portion and the source portion, through adjacent ones of the gate portions. Thus, in the semiconductor device, electric current can flow between the drain portion and the source portion via the two-dimensional electron gas layer. On the other hand, when a negative voltage is applied to the gate portions, a negative voltage is applied to the two-dimensional hole gas layer, since the gate portions and the two-dimensional hole gas layer are in ohmic contact with each other, and the two-dimensional electron gas layer and two-dimensional hole gas layer of the semiconductor laminated body are depleted. The two-dimensional electron gas layer and the two-dimensional hole gas layer are opposed to each other in the lamination direction of the semiconductor laminated body, namely, in a direction perpendicular to a direction that connects the drain portion with the source portion. Therefore, when the two-dimensional electron gas layer and the two-dimensional hole gas layer are depleted, an electric field is generated in the direction perpendicular to the direction that connects the drain portion with the source portion. Like a known superjunction structure using p-n junction, the heterojunction type superjunction structure in which the electric field is generated in the above manner can make the strength of electric field between the drain portion and the source portion uniform. In particular, the strength of electric field in a drift region between the drain portion and the gate portion can be made uniform, so that the semiconductor device having the heterojunction type superjunction structure is supposed to have a high breakdown voltage.

SUMMARY

In the semiconductor devices disclosed in JP 2017-22323 A and JP 2017-73526 A, dielectric isolation between each gate portion and the two-dimensional electron gas layer is established by p-n junction. The p-n junction has a low breakdown field strength. For example, when a negative voltage of minus several volts (V) is applied to the gate portion, insulation leakage may occur between the gate portion and the two-dimensional electron gas layer. Therefore, in the semiconductor devices disclosed in JP 2017-22121 A and JP 2017-73526 A, a sufficiently low negative voltage cannot be applied to the gate portion so as to avoid the insulation leakage, and the two-dimensional electron gas layer and the two-dimensional hole gas layer may not be favorably depleted. Thus, in the semiconductor devices disclosed in JP 2017-22323 A and JP 2017-73526 A, even though the heterojunction type superjunction structure is employed in the semiconductor laminated body, its capability cannot be sufficiently exhibited, and the breakdown voltage may be low.

This disclosure provides a technology for favorably depleting a two-dimensional electron gas layer and a two-dimensional hole gas layer of a semiconductor laminated body, in a semiconductor device having a heterojunction type superjunction structure.

A semiconductor device according to a first aspect of the disclosure includes a drain portion, a source portion, a semiconductor laminated body, and a gate portion or portions. The semiconductor laminated body is provided between the drain portion and the source portion. The semiconductor laminated body consists of a plurality of semiconductor layers laminated together, and has at least a first heterojunction and a second heterojunction. The semiconductor laminated body has a two-dimensional electron gas layer adjacent to an interface of the first heterojunction, and a two-dimensional hole gas layer adjacent to an interface of the second heterojunction. A pair of two-dimensional electron gas layer and two-dimensional hole gas layer of the semiconductor laminated body may appear repeatedly in the lamination direction. The gate portion is located between the drain portion and the source portion, and extends through the first heterojunction and the second heterojunction of the semiconductor laminated body. The drain portion and the source portion are electrically connected to one of the two-dimensional electron gas layer and the two-dimensional hole gas layer. The gate portion is configured to be prevented by an insulating region from directly contacting the one of the two-dimensional electron gas layer and the two-dimensional hole gas layer. In the semiconductor device of this aspect, one of the two-dimensional electron gas layer and the two-dimensional hole gas layer, and the gate portion, are insulated from each other by the insulating region, so that insulation leakage is less likely or unlikely to occur in this portion. Thus, a voltage sufficient to favorably deplete the two-dimensional electron gas layer and two-dimensional hole gas layer of the semiconductor laminated body can be applied to the gate portion. The semiconductor device of this aspect can exhibit a high breakdown voltage characteristic.

A semiconductor device according to a second aspect of the disclosure includes a drain portion, a source portion, a semiconductor laminated body, and a gate portion or portions. The semiconductor laminated body is provided between the drain portion and the source portion. The semiconductor laminated body consists of a plurality of semiconductor layers laminated together, and has at least a first heterojunction and a second heterojunction. The semiconductor laminated body has a two-dimensional electron gas layer adjacent to an interface of the first heterojunction, and a two-dimensional hole gas layer adjacent to an interface of the second heterojunction. A pair of two-dimensional electron gas layer and two-dimensional hole gas layer of the semiconductor laminated body may appear repeatedly in the lamination direction. The gate portion is located between the drain portion and the source portion, and extends through the first heterojunction and the second heterojunction of the semiconductor laminated body. The drain portion has a first-conductivity-type drain semiconductor region, and the source portion has a first-conductivity-type source semiconductor region. The gate portion has a second-conductivity-type gate semiconductor region. The drain semiconductor region of the drain portion and the source semiconductor region of the source portion are electrically connected to one of the two-dimensional electron gas layer and the two-dimensional hole gas layer. The gate semiconductor region of the gate portion is configured to be prevented by an insulating region from contacting, the one of the two-dimensional electron gas layer and the two-dimensional hole gas layer via p-n junction. In the semiconductor device of this aspect, one of the two-dimensional electron gas layer and the two-dimensional hole gas layer, and the gate portion, are insulated from each other by the insulating region, so that insulation leakage is less likely or unlikely to occur in this portion. Thus, a voltage sufficient to favorably deplete the two-dimensional electron gas layer and two-dimensional hole gas layer of the semiconductor laminated body can be applied to the gate portion. The semiconductor device of this aspect can exhibit a high breakdown voltage characteristic.

A semiconductor device according to a third aspect of the disclosure includes a drain portion, a source portion, a semiconductor laminated body, and a gate portion or portions. The semiconductor laminated body is provided between the drain portion and the source portion. The semiconductor laminated body consists of a plurality of semiconductor layers laminated together, and has at least a first heterojunction and a second heterojunction. The semiconductor laminated body has a two-dimensional electron gas layer adjacent to an interface of the first heterojunction, and a two-dimensional hole gas layer adjacent to an interface of the second heterojunction. A pair of two-dimensional electron gas layer and two-dimensional hole gas layer of the semiconductor laminated body may appear repeatedly in the lamination direction. The gate portion is located between the drain portion and the source portion, and extends through the first heterojunction and the second heterojunction of the semiconductor laminated body. The gate portion has a Schottky electrode made of a material that permits Schottky junction between the Schottky electrode and the semiconductor laminated body. The drain portion and the source portion are electrically connected to one of the two-dimensional electron gas layer and the two-dimensional hole gas layer. The Schottky electrode of the gate portion is configured to be prevented by an insulating region from contacting the one of the two-dimensional electron gas layer and the two-dimensional hole gas layer via the Schottky junction. In the semiconductor device of this aspect, one of the two-dimensional electron gas layer and the two-dimensional hole gas layer, and the gate portion, are insulated from each other by the insulating region, so that insulation leakage is less likely or unlikely to occur in this portion. Thus, a voltage sufficient to favorably deplete the two-dimensional electron gas layer and two-dimensional hole gas layer of the semiconductor laminated body can be applied to the gate portion. The semiconductor device of this aspect can exhibit a high breakdown voltage characteristic.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

First Embodiment

Figure 1:
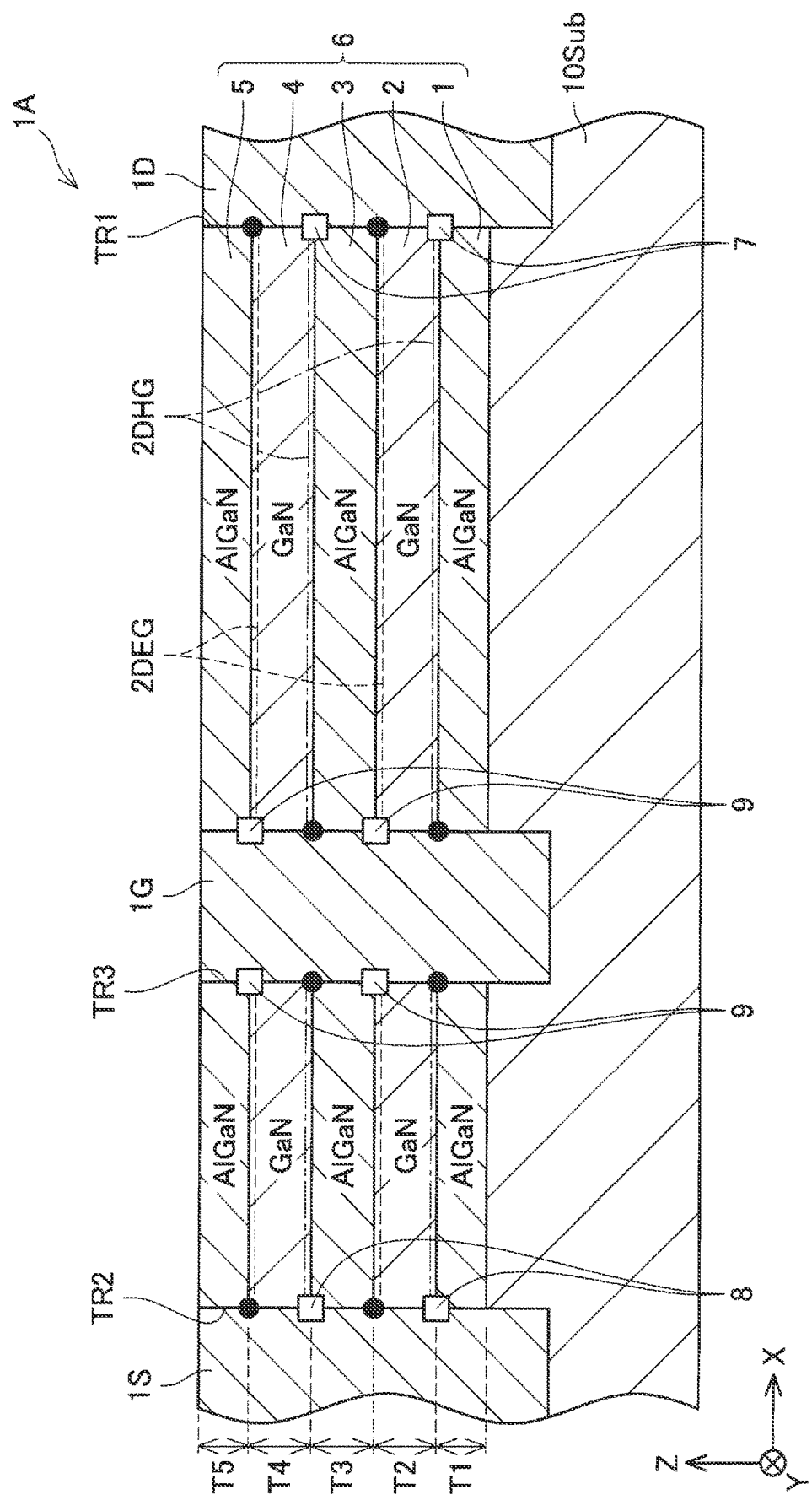
FIG. 1 is a cross-sectional view schematically showing a cross-section of a principal part of a semiconductor device of a first embodiment, which is taken along line I-I in FIG. 3.
Figure 2:
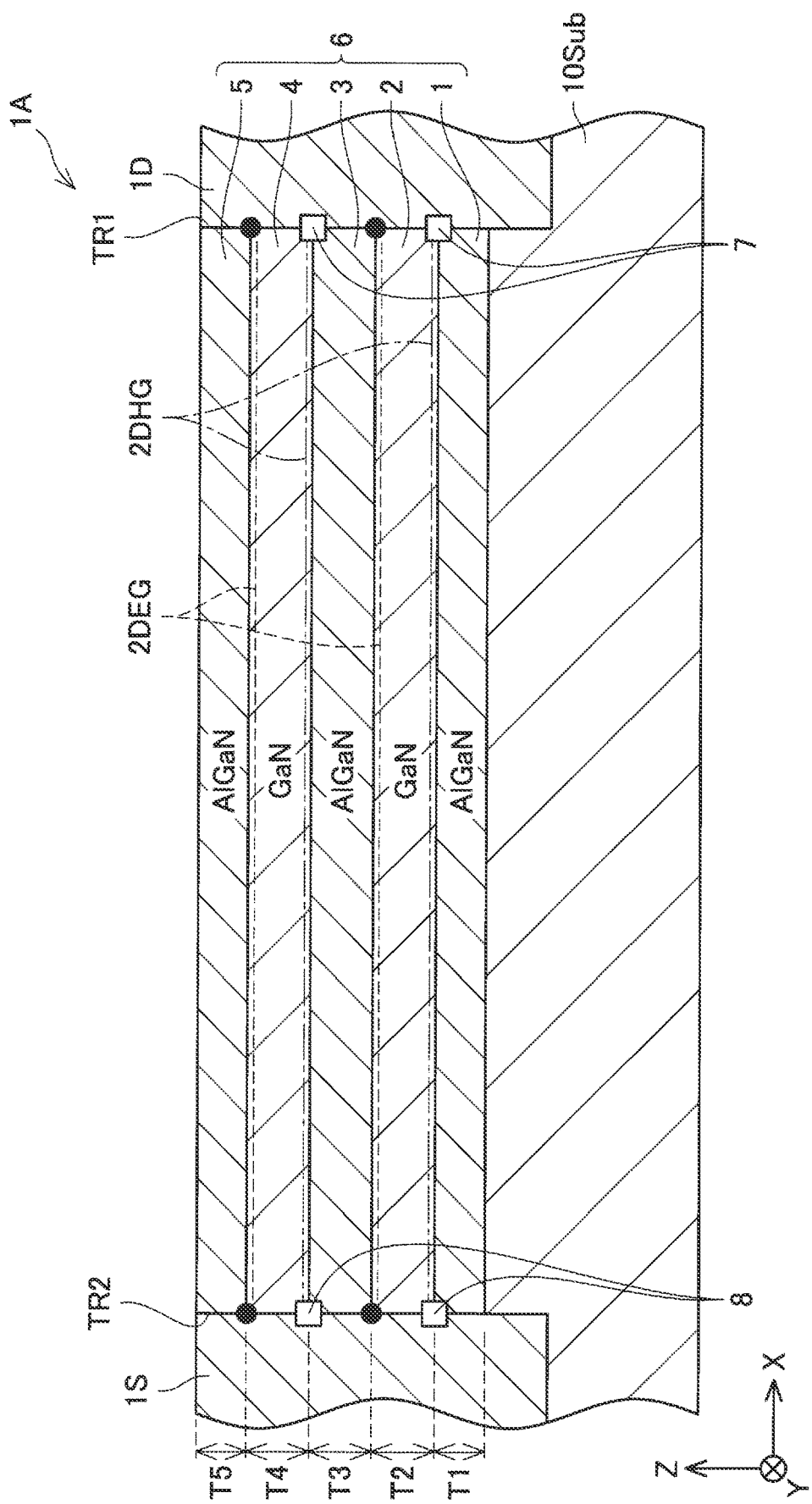
FIG. 2 is a cross-sectional view schematically showing a cross-section of a principal part of the semiconductor device of the first embodiment, which is taken along line II-II in FIG. 3.
Figure 3:
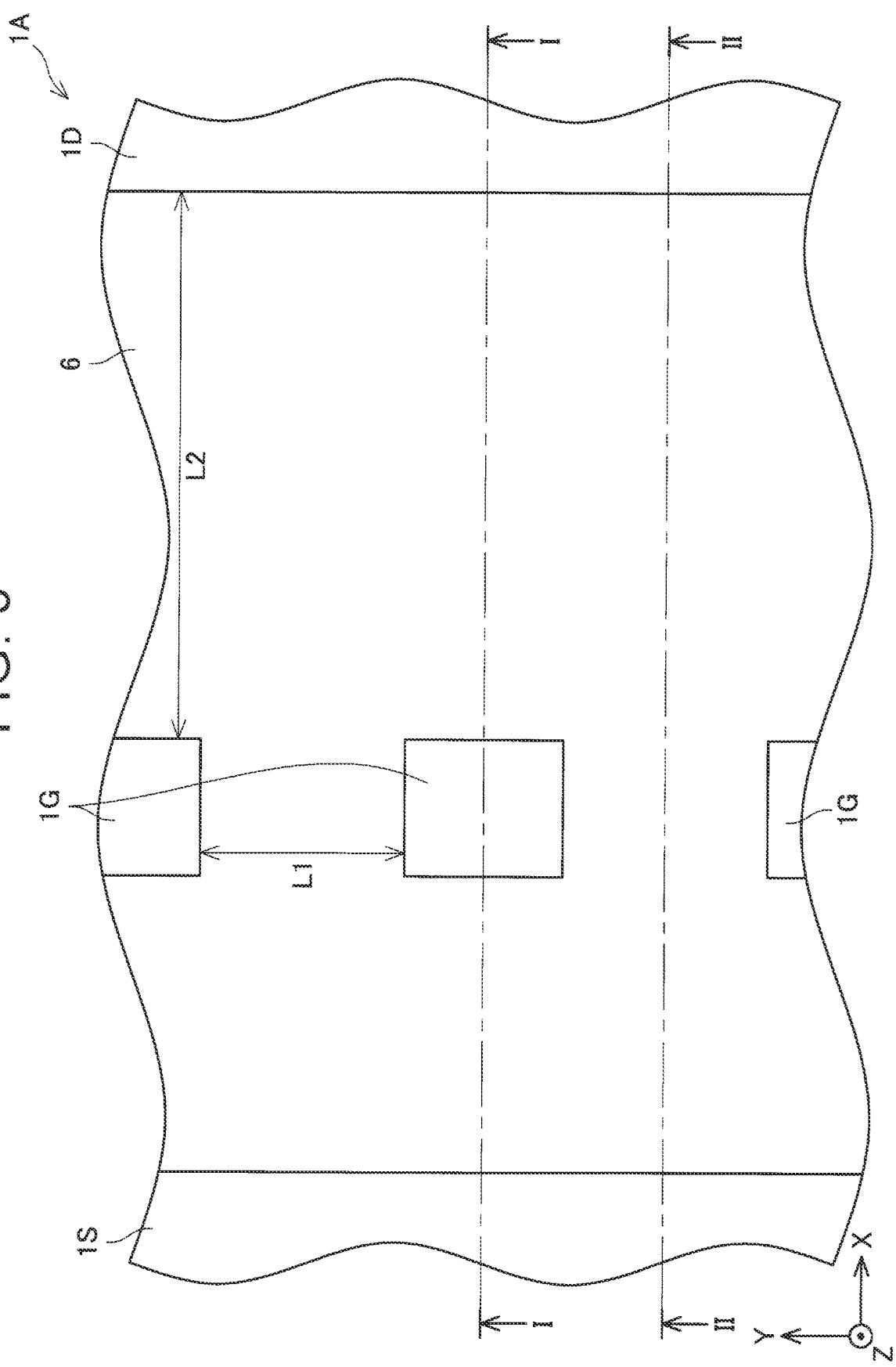
FIG. 3 is a plan view schematically showing a principal part of the semiconductor device of the first embodiment.

Referring to FIG. 1 to FIG. 3, a semiconductor device 1A having a heterojunction type superjunction structure will be described. The semiconductor device 1A includes a substrate 10Sub, semiconductor laminated body 6, drain portion 1D, source portion 1S, and a plurality of gate portions 1G.

The substrate 10Sub is formed of a material that permits crystal growth of the semiconductor laminated body 6. In this embodiment, the semiconductor laminated body 6 is a nitride semiconductor. Therefore, a semi-insulating substrate of a nitride semiconductor or silicon, for example, sapphire substrate, or the like, may be used as the substrate 10Sub, though it is not particularly limited to these materials. Where the semiconductor laminated body 6 is a GaAs-based semiconductor, a GaAs-based semi-insulating substrate, sapphire substrate, or the like, may be used as the substrate 10Sub, though it is not particularly limited to these materials. Here, the substrate mentioned in this specification refers to a portion, having an interface level at its surface. For example, where a buffer layer is provided for improving the crystalline nature of the semiconductor laminated body 6, and there is an interface level between the buffer layer and the substrate 10Sub, the buffer layer forms a part of the semiconductor laminated body 6, and the substrate 10Sub provides the substrate of this specification. On the other hand, where there is an interface level between the buffer layer and the semiconductor laminated body 6, the substrate 10Sub including the buffer layer provides the substrate of this specification.

The semiconductor laminated body 6 is provided on the surface of the substrate 10Sub, and has a first semiconductor layer 1, second semiconductor layer 2, third semiconductor layer 3, fourth semiconductor layer 4, and fifth semiconductor layer 5. The first semiconductor layer 1, second semiconductor layer 2, third semiconductor layer 3, fourth semiconductor layer 4, and fifth semiconductor layer 5 are laminated in this order on the surface of the substrate 10Sub. The first semiconductor layer 1, third semiconductor layer 3, and fifth semiconductor layer 5 are i-AlGaN layers. The second semiconductor layer 2 and the fourth semiconductor layer 4 are i-GaN layers. The bandgap of i-AlGaN is wider than that of i-GaN. Therefore, the semiconductor laminated body 6 is constructed by joining adjacent semiconductor layers in the lamination direction to form heterojunctions.

The i-AlGaN of the first semiconductor layer 1, third semiconductor layer 3 and fifth semiconductor layer 5 is polarized through spontaneous polarization, and piezoelectric polarization. The first semiconductor layer 1 has negative fixed charge in the vicinity of its heterojunction interface with the second semiconductor layer 2. Therefore, a two-dimensional hole gas layer (2DHG) is produced on the second semiconductor layer 2 side of the heterojunction interface between the first semiconductor layer 1 and the second semiconductor layer 2. The third semiconductor layer 3 has positive fixed charge in the vicinity of its heterojunction interface with the second semiconductor layer 2, and has negative fixed charge in the vicinity of its heterojunction interface with the fourth semiconductor layer 4. Therefore, a two-dimensional electron gas layer (2DEG) is produced on the second semiconductor layer 2 side of the heterojunction interface between the second semiconductor layer 2 and the third semiconductor layer 3, and a two-dimensional hole gas layer is produced on the fourth semiconductor layer 4 side of the heterojunction interface between the third semiconductor layer 3 and the fourth semiconductor layer 4. The fifth semiconductor layer 5 has positive fixed charge in the vicinity of its heterojunction interface with the fourth semiconductor layer 4. Therefore, a two-dimensional electron gas layer is produced on the fourth semiconductor layer 4 side of the heterojunction interface between the fourth semiconductor layer 4 and the fifth semiconductor layer 5. Thus, in the semiconductor laminated body 6, two pairs of two-dimensional electron gas layer and two-dimensional hole gas layer are arranged in parallel rows in the lamination direction (Z direction). The two-dimensional electron gas layer and two-dimensional hole gas layer of each pair are opposed to each other in the lamination direction (Z direction).

The drain portion 1D and the source portion 1S are spaced from each other in one direction (X direction), in a major plane of the semiconductor laminated body 6. The drain portion 1D is provided in a trench TR1 for drain, which is formed through the semiconductor laminated body 6 to extend from a surface of the semiconductor laminated body 6 and reach the substrate 10Sub. However, the drain portion 1D may not reach the substrate 10Sub, but is only required to extend through the two-dimensional electron gas layers and the two-dimensional hole gas layers. The source portion 1S is provided in a trench TR2 for source, which is formed through the semiconductor laminated body 6 to extend from the surface of the semiconductor laminated body 6 and reach the substrate 10Sub. However, the source portion 1S may not reach the substrate 10Sub, but is only required to extend through the two-dimensional electron gas layers and the two-dimensional hole gas layers.

Each of the gate portions 1G is located between the drain portion 1D and the source portion 1S, and is provided in a trench TR3 for gate, which is formed through the semiconductor laminated body 6 to extend from the surface of the semiconductor laminated body 6 and reach the substrate 10Sub. However, each of the gate portions 1G may not reach the substrate 10Sub, but is only required to extend through the two-dimensional electron gas layers and the two-dimensional hole gas layers. The gate portions 1G are arranged to be spaced from each other in a direction (Y direction) perpendicular to the direction (X direction) that connects the drain portion 1D with the source portion 1S, and the lamination direction (Z direction) of the semiconductor laminated body 6. Therefore, a part of the semiconductor laminated body 6 is provided between adjacent ones of the gate portions 1G (see FIG. 2). With this arrangement, the two-dimensional electron gas layers and two-dimensional hole gas layers in the semiconductor laminated body 6 pass through between the adjacent gate portions 1G, and extend between the drain portion 1D and the source portion 1S. The gate portions 1G may be arranged along a straight line in the Y direction, or may be arranged while being slightly shifted in the X direction. Also, a distance L1 between adjacent ones of the gate portions 1G may differ depending on the combination of adjacent gate portions 1G. In this embodiment, the gate portions 1G are regularly arranged along the straight line in the Y direction. Thus, the distance L1 between adjacent ones of the gate portions 1G is constant or equal with respect to all combinations of adjacent gate portions 1G While a plurality of gate portions 1G is provided in this embodiment, it suffices that at least one gate portion 1G is provided.

Each of the drain portion 1D and the source portion 1S has an n-type semiconductor region. The n-type semiconductor region, of the drain portion 1D may be arranged to fill the trench TR1 for drain, or may be provided so as to cover the periphery of a metal electrode that fills the trench TR1 for drain. The n-type semiconductor region of the source portion 1S may also be arranged to fill the trench TR2 for source, or may be provided so as to cover the periphery of a metal electrode that fills the trench TR2 for source. In either case, each of the drain portion 1D and the source portion 1S has the n-type semiconductor region located at its surface in contact with the semiconductor laminated body 6.

Each of the gate portions 1G has a p-type semiconductor region. The p-type semiconductor region of each of the gate portions 1G may be arranged to fill the trench TR3 for gate, or may be provided so as to cover the periphery of a metal electrode that fills the trench TR3 for gate. In either case, each of the gate portions 1G has the p-type semiconductor region located at its surface in contact with the semiconductor laminated body 6.

In FIG. 1 and FIG. 2, black circles represent electrically connected portions, and white squares represent electrically insulated portions. As described above, each of the drain portion 1D and the source portion 1S has then-type semiconductor region located at its surface in contact with the semiconductor laminated body 6. Therefore, the n-type semiconductor region of each of the drain portion 1D and the source portion 1S is electrically connected to, typically, in ohmic contact with the two-dimensional electron gas layers (2DEG) produced in the semiconductor laminated body 6. On the other hand, the n-type semiconductor region of each of the drain portion 1D and the source portion 1S is electrically insulated from the two-dimensional hole gas layers (2DEG) produced in the semiconductor laminated body 6.

The n-type semiconductor region of the drain portion 1D may be electrically insulated from the two-dimensional hole gas layers produced in the semiconductor laminated body 6, by contacting the hole gas layers via p-n junctions. However, the n-type semiconductor region of the drain portion 1D is prevented by insulating regions 7 from contacting the two-dimensional hole gas layers via p-n junctions, so as to reduce the strength of electric field. More specifically, the n-type semiconductor region of the drain portion 1D may be spaced from the two-dimensional hole gas layers by the insulating regions 7, so as not to directly contact the two-dimensional hole gas layers. Here, the insulating region 7 is a structure for eliminating a two-dimensional hole gas layer that would be produced in the absence of the insulating region 7. The insulating region 7 may be present in a region between, each two-dimensional hole gas layer and the drain portion 1D so as to eliminate the two-dimensional hole gas layer, or may be located adjacent to a region between each two-dimensional hole gas layer and the drain portion 1D so as to eliminate the two-dimensional hole gas layer. The insulating region 7 is in the form of, for example, a void, insulating body, or insulating or semi-insulating high-resistance semiconductor.

The n-type semiconductor region of the source portion 1S may be electrically insulated from the two-dimensional hole gas layers produced in the semiconductor laminated body 6, by contacting the hole gas layers via p-n junctions. However, the n-type semiconductor region of the source portion 1S is prevented by insulating regions 8 from contacting the two-dimensional hole gas layers via p-n junctions, so as to reduce the strength of electric field. More specifically, the n-type semiconductor region of the source portion 1S may be spaced from the two-dimensional hole gas layers by the insulating regions 8, so as not to directly contact the two-dimensional hole gas layers. Here, the insulating region 8 is a structure for eliminating a two-dimensional hole gas layer that would be produced in the absence of the insulating region 8. The insulating region 8 may be present in a region between each two-dimensional hole gas layer and the source portion 1S so as to eliminate the two-dimensional hole gas layer, or may be located adjacent to a region between each two-dimensional hole gas layer and the source portion 1S so as to eliminate the two-dimensional hole gas layer. The insulating region 8 is in the form of, for example, a void, insulating body, or insulating or semi-insulating high-resistance semiconductor.

As described above, each of the gate portions 1G has the p-type semiconductor region located at its surface in contact with the semiconductor laminated body 6. Thus, the p-type semiconductor region of each of the gate portions 1G is in ohmic contact with the two-dimensional hole gas layers produced in the semiconductor laminated body 6. Meanwhile, the p-type semiconductor region of each of the gate portions 1G is electrically insulated from the two-dimensional electron gas layers produced in the semiconductor laminated body 6. In particular, the p-type semiconductor region of each of the gate portions 1G is prevented by insulating regions 9 from contacting the two-dimensional electron gas layers via p-n junctions. More specifically, the p-type semiconductor region of each of the gate portions 1G is spaced from the two-dimensional electron gas layers by the insulating regions 9, so as not to directly contact the two-dimensional electron gas layers. Here, the insulating region 9 is a structure for eliminating a two-dimensional electron gas layer that would be produced in the absence of the insulating region 9. The insulating region 9 may be present in a region between each two-dimensional electron gas layer and the gate portion 1C so as to eliminate the two-dimensional electron gas layer, or may be located adjacent to a region between each two-dimensional electron gas layer and the gate portion 1C so as to eliminate the two-dimensional electron gas layer. The insulating region 9 is in the form of, for example, a void, insulating body, or insulating or semi-insulating high-resistance semiconductor.

Next, operation of the semiconductor device 1A will be described. When a positive voltage is applied to the drain portion 1D, and the source portion 1S is grounded, while the gate portions 1G are grounded, the semiconductor device 1A is placed in the ON state. At this time, the drain portion 1D and the source portion 1S are electrically connected to each other, via the two-dimensional electron gas layers in the semiconductor laminated body 6. Thus, the semiconductor device 1A can provide low ON resistance, since electric current flows via the two-dimensional electron gas layers.

When a positive voltage is applied to the drain portion 1D, and the source portion 1S is grounded, while a negative voltage is applied to each gate portion 1G, the semiconductor device 1A is placed in the OFF state. The gate portion 1G is in ohmic contact with the two-dimensional hole gas layers in the semiconductor laminated body 6. Therefore, the potential of the two-dimensional hole gas layers in the semiconductor laminated body 6 can vary in accordance with the potential applied to the gate portion 1G. In this case, a negative voltage is applied to the gate portion 1G, so that a negative voltage is applied to the two-dimensional hole gas layers in the semiconductor laminated body 6. As a result, the two-dimensional hole gas layers and two-dimensional electron gas layers in the semiconductor laminated body 6 are depleted. When the two-dimensional hole gas layers and the two-dimensional electron gas layers are depleted, positive and negative fixed charges remain on the first semiconductor layer 1, third semiconductor layer 3 and fifth semiconductor layer 5. As a result, electric fields between these fixed charges are generated in the lamination direction perpendicular to the direction that connects the drain portion 1D and the source portion 1S. Thus, the semiconductor device 1A has a heterojunction type superjunction structure, and can make the strength of electric field between the drain portion 1D and the source portion 1S uniform, like a superjunction structure of a normal p-n junction type. In particular, the strength of electric field in a drift region between the drain portion 1D and the gate portion 1G can be made uniform, so that the semiconductor device 1A can exhibit a high breakdown voltage characteristic.

Further, in the semiconductor device 1A, the p-type semiconductor region of each of the gate portions 1G is insulated by the insulating regions 9, from the two-dimensional electron gas layers in the semiconductor laminated body 6. Therefore, a sufficiently low negative voltage can be applied to the p-type semiconductor region of each of the gate portions 1G, while curbing insulation leakage between the p-type semiconductor region of each of the gate portions 1G and the two-dimensional electron gas layers. In other words, the insulating region 9 is configured to maintain its insulating performance at a threshold voltage applied to the gate portion 1G. It may be stated otherwise that, even when a negative voltage required to favorably deplete the two-dimensional hole gas layers and two-dimensional electron gas layers in the semiconductor laminated body 6 is applied to the gate portion 1G, insulation leakage is less likely or unlikely to occur between the p-type semiconductor region of the gate portion 1G and the two-dimensional electron gas layers. Thus, the two-dimensional hole gas layers and two-dimensional electron gas layers in the semiconductor laminated body 6 are favorably deleted, and the semiconductor device 1A can exhibit a high breakdown voltage characteristic.

Further, in the semiconductor device 1A, the n-type semiconductor region of each of the drain portion 1D and the source portion 1S is insulated by the insulating regions 7, 8, from the two-dimensional hole gas layers in the semiconductor laminated body 6. Therefore, insulation leakage is less likely or unlikely to occur between the n-type semiconductor region of each of the drain portion 1D and the source portion 1S and the two-dimensional hole gas layers, and the semiconductor device 1A can exhibit a high breakdown voltage characteristic.

Other characteristics of the semiconductor device 1A will be listed, (1) As described above, when the semiconductor device 1A is placed in the OFF state, electric fields are formed between the remaining fixed charges, in the semiconductor laminated body 6. The electric fields formed in the second semiconductor layer 2, third semiconductor layer 3, and fourth semiconductor layer 4 are strong, and these semiconductor layers 2, 3, 4 are favorably depleted. On the other hand, in the first semiconductor layer 1 located closest to the rear surface of the semiconductor laminated body 6, an electric field formed in the first semiconductor layer 1 is weaker than those of the other semiconductor layers 2, 3, 4, due to an influence of the interface level between the first semiconductor layer 1 and the substrate 10Sub. Also, in the fifth semiconductor layer 5 located closest to the top face of the semiconductor laminated body 6, an electric field formed in the fifth semiconductor layer 5 is weaker than those of the other semiconductor layers 2, 3, 4, due to an influence of its surface level. Thus, when the semiconductor device 1A is placed in the OFF state, carriers caused by background impurities (impurities un intendedly contained during manufacture) in the first semiconductor layer 1 and the fifth semiconductor layer 5 remain, and there is a concern that the first semiconductor layer 1 and the fifth semiconductor layer 5 may not be completely depleted. Depending on the breakdown voltage required of the semiconductor device 1A, it may be desirable to completely deplete the first semiconductor layer 1 and the fifth semiconductor layer 5. Therefore, in the semiconductor device 1A, the thickness T1 of the first semiconductor layer 1 and the thickness T5 of the fifth semiconductor layer 5 are adjusted, so as to increase the strength of the electric field formed in the first semiconductor layer 1 and the strength of the electric field formed in the fifth semiconductor layer 5. For example, the electric field applied to the first semiconductor layer 1 is based on a potential difference arising from the two-dimensional hole gas layer immediately above the first semiconductor layer 1 and the interface level. Therefore, the strength of the electric field applied to the first semiconductor layer 1 is increased by reducing the thickness T1 of the first semiconductor layer. The electric field applied to the fifth semiconductor layer 5 is based on a potential difference arising from the two-dimensional electron gas layer immediately below the fifth semiconductor layer 5 and the surface level. Therefore, the strength of the electric field applied to the fifth semiconductor layer 5 is increased by reducing the thickness T5 of the fifth semiconductor layer 5. The thickness T1 of the first semiconductor layer 1 and the thickness T5 of the fifth semiconductor layer 5 may be adjusted so as to be smaller than any of the distances between adjacent ones of the two-dimensional electron gas layers and two-dimensional hole gas layers in the semiconductor laminated body 6. In this embodiment, the thickness T1 of the first semiconductor layer 1 and the thickness T5 of the fifth semiconductor layer 5 may be smaller than the thicknesses T2, T3, T4 of the other semiconductor layers 2, 3, 4. The thicknesses T2, T3, T4 of the semiconductor layers 2, 3, 4 are equal. With the thickness T1 of the first semiconductor layer 1 and the thickness T5 of the fifth semiconductor layer 5 thus adjusted, the carriers derived from the background impurities in the first semiconductor layer 1 and the fifth semiconductor layer 5 are removed and the first semiconductor layer 1 and the fifth semiconductor layer 5 are favorably depleted.

(2) As described above, in the semiconductor device 1A, the interface level is formed between the first semiconductor layer 1 and the substrate 10Sub, and the surface level is formed on the surface of the fifth semiconductor layer 5. However, the interface level and the surface level are not stabilized for various reasons, and may become lower levels than expected. Therefore, there is a concern that the first semiconductor layer 1 and the fifth semiconductor layer 5 may not be favorably depleted, even if the thickness T1 of the first semiconductor layer 1 and the thickness T5 of the fifth semiconductor layer 5 are adjusted to be small. Thus, in order to sufficiently yield the effects of the interface level and the surface level, defects may be introduced into the interface between the first semiconductor layer 1, and the substrate 10Sub so that the interface defect density becomes equal to or greater than $1 \times 10^{11}$ cm$^{-2}$, and defects may be introduced into the surface or interface of the fifth semiconductor layer 5 so that the surface defect density of the fifth semiconductor layer 5 becomes equal to or greater than $1 \times 10^{11}$ cm$^{-2}$. As a result, the effects of the interface level and the surface level are sufficiently yielded, and the first semiconductor layer 1 and the fifth semiconductor layer 5 can be favorably depleted when the thickness T1 of the first semiconductor layer 1 and the thickness T5 of the fifth semiconductor layer 5 are adjusted to be small.

(3) If the thickness T1 of the first semiconductor layer 1 and the thickness T5 of the fifth semiconductor layer 5 are equal to the thicknesses T2, T3, T4 of the other semiconductor layers 2, 3, 4, the carrier density of a carrier gas layer (in this example, 2DHG in the vicinity of the heterojunction interface between the first semiconductor layer 1 and the second semiconductor layer 2) closest to the rear surface of the semiconductor laminated body 6, and the carrier density of a carrier gas layer (in this example, 2DEG in the vicinity of the hetero junction interface between the fourth semiconductor layer 4 and the fifth semiconductor layer 5) closest to the top face of the semiconductor laminated body 6 become larger than the carrier densities of the other two-dimensional electron gas layer and two-dimensional hole gas layer. Therefore, in the semiconductor laminated body 6, the carrier balance of the two-dimensional electron gas layers and the two-dimensional hole gas layers is impaired or lost. In this case, when the semiconductor device 1A is placed in the OFF state, carriers corresponding to the difference in the carrier density may remain, and the semiconductor laminated body 6 may not be favorably depleted. On the other hand, if the thickness T1 of the first semiconductor layer 1 is adjusted to be small, the carrier density of the carrier gas layer closest to the rear surface of the semiconductor laminated body 6 is reduced. If the thickness T5 of the fifth semiconductor layer 5 is adjusted to be small, the carrier density of the carrier gas layer closest to the top face of the semiconductor laminated body 6 is reduced. With this arrangement, the carrier densities of all of the two-dimensional electron gas layers and two-dimensional hole gas layers in the semiconductor laminated body 6 become substantially equal. As a result, when the semiconductor device 1A is placed in the OFF state, the semiconductor laminated body 6 is favorably depleted, and the semiconductor device 1A has a high breakdown voltage characteristic. In this connection, it is said that the carrier densities of two carrier gas layers are substantially equal to each other, when a difference between the carrier densities is equal to or smaller than 10%. It is desirable that the difference between the carrier densities of two carrier gas layers is equal to or smaller than 5%.

However, it is not necessary that all of the two-dimensional electron gas layers and two-dimensional hole gas layers in the semiconductor laminated body 6 have substantially the same carrier density. For example, if each pair of adjacent two-dimensional electron gas layer and two-dimensional hole gas layer have substantially the same carrier density, the semiconductor laminated body 6 can be favorably depleted. Namely, in the case of this embodiment, it suffices that a pair of the 2DHG in the vicinity of the heterojunction interface of the first semiconductor layer 1 and the second semiconductor layer 2, and the 2DEG in the vicinity of the heterojunction interface of the second semiconductor layer 2 and the third semiconductor layer 3, have substantially the same carrier density. Also, it suffices that a pair of the 2DHG in the vicinity of the heterojunction interface of the third semiconductor layer 3 and the fourth semiconductor layer 4, and the 2DEG in the vicinity of the heterojunction interface of the fourth semiconductor layer 4 and the fifth semiconductor layer 5, have substantially the same carrier density. In this case, the carrier density of the former pair may be equal to or different from the carrier density of the latter pair. Accordingly, it is also effective to adjust the thickness T1 of the first semiconductor layer 1 and the thickness 15 of the fifth semiconductor layer 5, so as to satisfy the above relationship. In this case, too, when the semiconductor device 1A is placed in the OFF state, the semiconductor laminated body 6 is favorably depleted, so that the semiconductor device 1A can exhibit a high breakdown voltage characteristic. While two pairs of two-dimensional electron gas layers and two-dimensional hole gas layers are present in the semiconductor device 1A of this embodiment, the above arrangement may also be applied to an embodiment in which only one pair of a two-dimensional electron gas layer and a two-dimensional electron hole layer are present in the semiconductor device, and an embodiment in which three or more pairs of two-dimensional electron gas layers and two-dimensional hole gas layers are present in the semiconductor device.

(4) As shown in FIG. 3, where L1 denotes the distance, between adjacent ones of the gate portions 1G, and L2 denotes the distance between the gate portion 1G and the drain portion 1D, a relationship of L1<2×L2 may be satisfied. With this relationship satisfied, when the semiconductor device 1A is placed in the OFF state, portions of the semiconductor laminated body 6 between adjacent ones of the gate portions 1G are depleted, before the gate portions 1G and the drain portion 1D are depleted; therefore, the semiconductor device 1A can exhibit a high breakdown voltage characteristic. The distance L1 may be maximized as long as the relationship of L1<2×L2 is satisfied. As a result, the distance L1 between adjacent ones of the gate portions 1G is increased, so that the channel resistance can be minimized.

Figure 4:
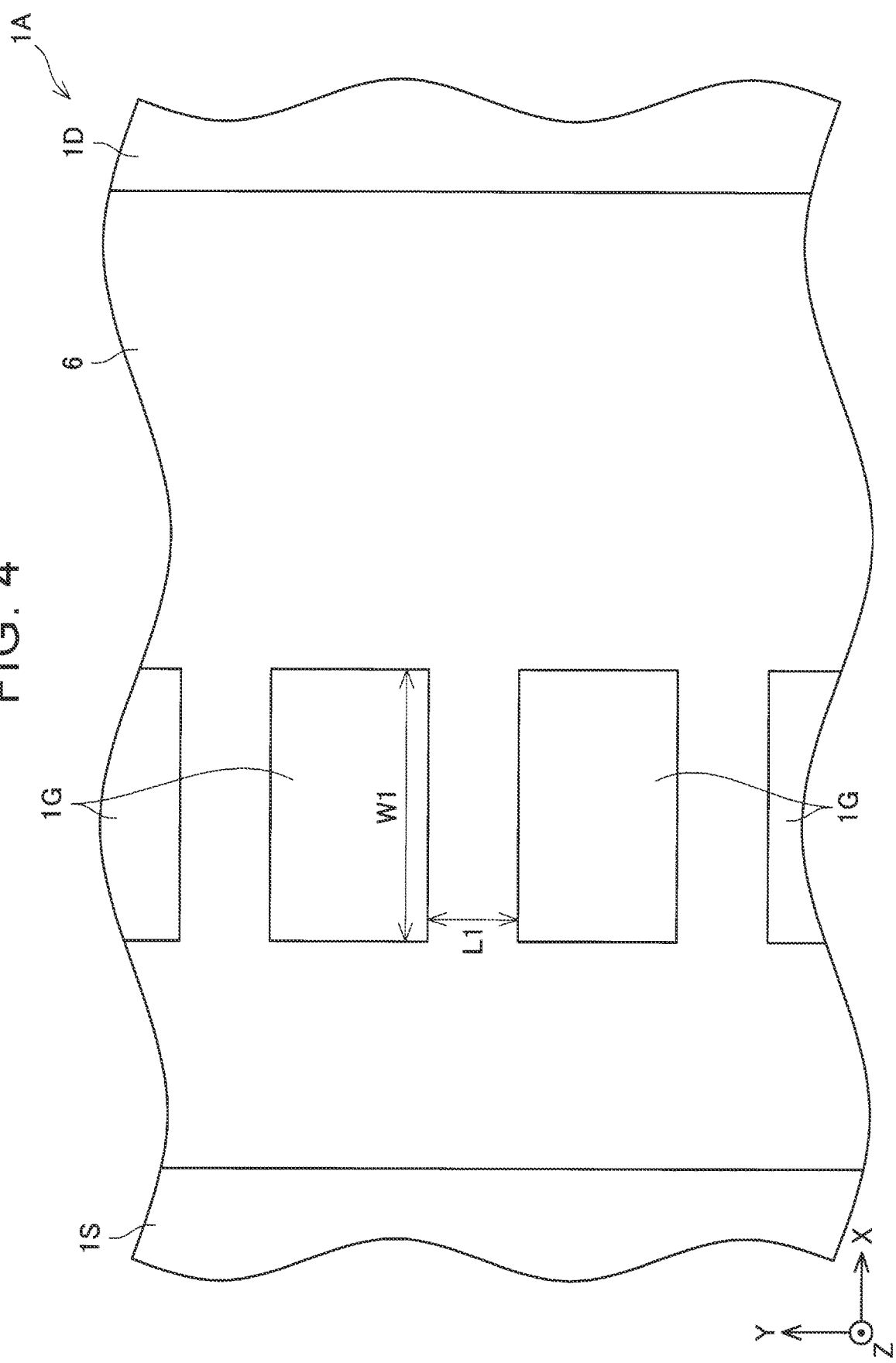
FIG. 4 is a plan view schematically showing a principal part of a semiconductor device as a modified example of the first embodiment.

(5) As shown in FIG. 4, where L1 denotes the distance between adjacent ones of the gate portions 1G, and W1 denotes the width of the gate portion 10 as measured in the direction (X direction) that connects the drain portion 1D with the source portion 1S, a relationship of L1<W1 may be satisfied. With this relationship satisfied, even when a high voltage is applied to the drain portion 1D, because of shorting of a load, for example, portions between adjacent ones of the gate portions 1G can be kept depleted. Thus, the semiconductor device 1A can exhibit a high breakdown voltage characteristic.

(6) In the semiconductor device 1A, the two-dimensional electron gas layer and the two-dimensional hole gas layer are located next to each other in the lamination direction. Therefore, there is a concern that leak current may flow between the two-dimensional electron gas layer and the two-dimensional hole gas layer. To reduce this possibility, the semiconductor laminated body 6 may be configured such that the two-dimensional electron gas layer is located in a quantum well or in a superlattice structure. Also, the semiconductor laminated body 6 may be configured such that the two-dimensional hole gas layer is located in a quantum well or in a superlattice structure. In this connection, leak current can be reduced if either one of the two-dimensional electron gas layer and the two-dimensional hole gas layer is located in a quantum well or in a superlattice structure.

Second Embodiment

Figure 5:
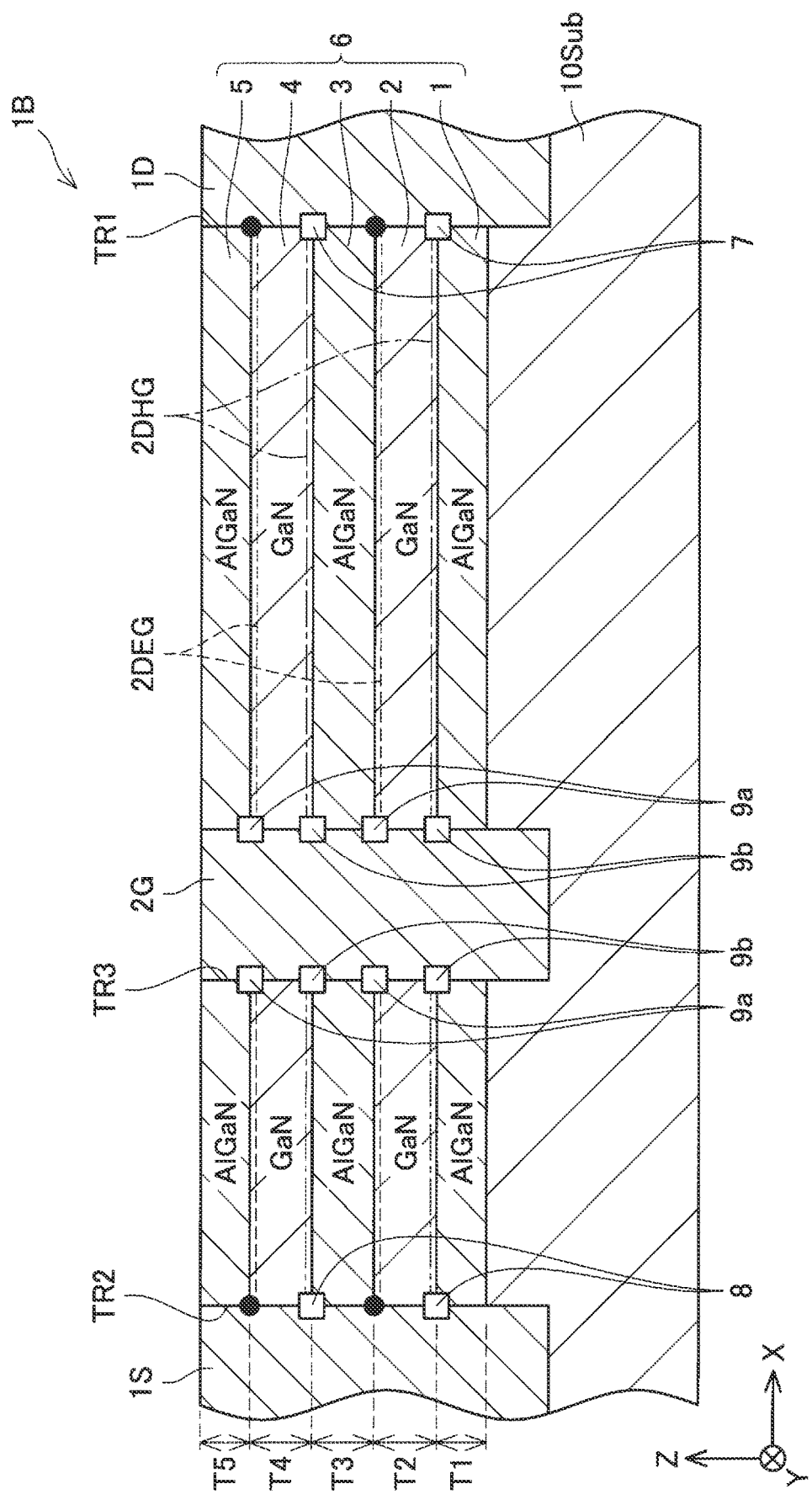
FIG. 5 is a cross-sectional view schematically showing a cross-section of a principal part of a semiconductor device of a second embodiment, which is taken along line in FIG. 3.

FIG. 5 shows a semiconductor device 1B of a second embodiment. The same reference numerals are assigned to substantially the same constituent elements as those of the semiconductor device 1A of the first embodiment, and explanation of these elements may not be provided. Although not illustrated in the drawings, a plurality of gate portions 2G is arranged to be spaced from each other in a direction perpendicular to the direction that connects the drain portion 1D with the source portion 1S and the lamination direction of the semiconductor laminated body 6, like the gate portions 1G of FIG. 3 and FIG. 4. The semiconductor device 1B is characterized in that each of the gate portions 2G has a Schottky electrode. In each of the gate portions 2G, the trench TR3 for gate is filled with the Schottky electrode. Further, in the semiconductor device 1B, the Schottky electrode in each of the gate portions 2G is electrically insulated from both of the two-dimensional electron gas layers (2DEG) and the two-dimensional hole gas layers (2DHG) produced in the semiconductor laminated body 6.

The Schottky electrode in each of the gate portions 2G is prevented by insulating regions 9a from contacting the two-dimensional electron gas layers via Schottky junction. More specifically, the Schottky electrode of each of the gate portions 2G is spaced from the two-dimensional electron gas layers with the insulating regions 9a provided therebetween, so that the Schottky electrode does not directly contact the two-dimensional electron gas layers. Here, the insulating region 9a is a structure for eliminating a two-dimensional electron gas layer that would be produced in the absence of the insulating region 9a. The insulating region 9a may be present in a region between each two-dimensional electron gas layer and the Schottky electrode of the gate portion 2G so as to eliminate the two-dimensional electron gas layer, or may be located adjacent to a region between the two-dimensional electron gas layer and the Schottky electrode of the gate portion 2G so as to eliminate the two-dimensional electron gas layer. The insulating region 9a is in the form of for example, a void, insulating body, or insulating or semi-insulating high-resistance semiconductor.

The Schottky electrode in each of the gate portions 2G is prevented by insulating regions 9b from contacting the two-dimensional hole gas layers via Schottky junction. More specifically, the Schottky electrode of each of the gate portions 2G is spaced from the two-dimensional hole gas layers with the insulating regions 9b provided therebetween, so that the Schottky electrode does not directly contact the two-dimensional hole gas layers. Here, the insulating region 9b is a structure for eliminating a two-dimensional hole gas layer that would be produced in the absence of the insulating region 9b. The insulating region 9b may be present in a region between each two-dimensional hole gas layer and the Schottky electrode of the gate portion 2G so as to eliminate the two-dimensional hole gas layer, or may be located adjacent to a region between each two-dimensional hole gas layer and the Schottky electrode of the gate portion 2G so as to eliminate the two-dimensional hole gas layer. The insulating region 9b is in the form of, for example, a void, insulating body, or insulating or semi-insulating high-resistance semiconductor.

Thus, in the semiconductor device 1B, each of the two-dimensional hole gas layers in the semiconductor laminated body 6 is insulated from all of the drain portion 1D, source portion 1S, and gate portions 2G; therefore, the potential of the two-dimensional hole gas layer is in a floating state. Here, in the semiconductor device 1B, capacitors provided by the insulating regions 9b between the gate portions 2G and the two-dimensional hole gas layers are connected in series with capacitors provided by the semiconductor layers 2, 4 between the two-dimensional hole gas layers and the two-dimensional electron gas layers and the series-connected capacitors are present between the gate portion 2G and the drain portion 1D. Thus, voltage Vpn between the two-dimensional hole gas layer and the two-dimensional electron gas layer can be expressed by an equation below, where Cgp denotes the capacitance between the gate portion 2G and the two-dimensional hole gas layer, Cpn denotes the capacitance between the two-dimensional hole gas layer and the two-dimensional electron gas layer, and Vgn denotes the voltage between the gate portion 2G and the two-dimensional electron gas layer.

$$Vpn = Vgn \times Cgp/(Cgp+Cpn)$$

Thus, in the semiconductor device 1B, the potential of the two-dimensional hole gas layer in the semiconductor laminated body 6 can vary in accordance with the potential applied to the gate portion 2G, through capacitance coupling. When a negative voltage is applied to the gate portions 2G, a negative voltage is applied to the two-dimensional hole gas layers in the semiconductor laminated body 6. As a result, the two-dimensional hole gas layers and two-dimensional electron gas layers in the semiconductor laminated body 6 are depleted. With the two-dimensional hole gas layers and two-dimensional electron gas layers thus depleted, positive and negative fixed charges remain in the first semiconductor layer 1, third semiconductor layer 3, and fifth semiconductor layer 5. Then, electric fields are generated between these fixed charges, in a direction perpendicular to the direction that connects the drain portion 1D with the source portion 1S. Thus, the semiconductor device 1B has a hetero junction type superjunction structure, and the strength of the electrode field between the drain portion 1D and the gate portion 2G can be made uniform, like a general p-n junction type superjunction structure. As a result, the semiconductor device 1B can exhibit a high breakdown voltage characteristic.

Referring to FIG. 6 to FIG. 13, some examples to which the technology of the above embodiments is applied will be described. In the following examples, the same reference numerals are assigned to substantially the same constituent elements, of which description may not be provided.

First Example

Figure 6:
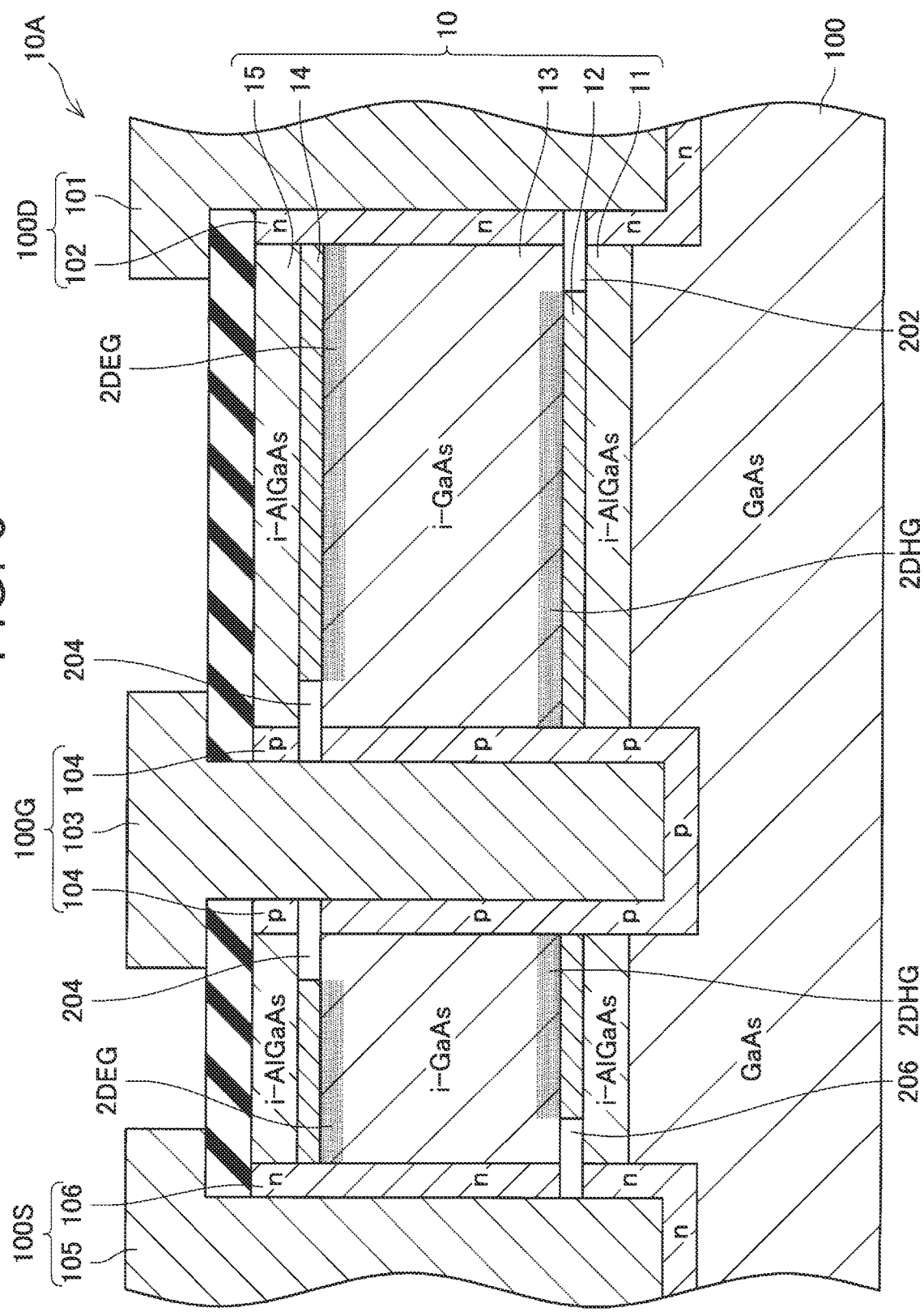
FIG. 6 is a cross-sectional view schematically showing a principal part of a semiconductor device of a first example.

As shown in FIG. 6, a semiconductor device 10A includes a substrate 100, semiconductor laminated body 10, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 10, like the gate portions 1G of FIG. 3 and FIG. 4.

The substrate 100 is a semi-insulating GaAs substrate. The substrate 100 may include a buffer layer of a GaAs-based semiconductor, for improvement of the crystalline nature of the semiconductor laminated body 10.

The semiconductor laminated body 10 is located between the drain portion 100D and the source portion 100S, and has a first barrier layer 11 of i-AlGaAs, hole supply layer 12 of p-InGaP, channel layer 13 of i-GaAs, electron supply layer 14 of n-InGaP, and second barrier layer 15 of i-AlGaAs. The first barrier layer 11, hole supply layer 12, channel layer 13, electron supply layer 14, and second barrier layer 15 are grown and formed in this order from a surface of the substrate 100, by a metal organic chemical vapor deposition (MOCVD) method. On a surface of the semiconductor laminated body 10, a protective film of silicon oxide is formed by a chemical vapor deposition (CVD) method.

The drain portion 100D is formed through the semiconductor laminated body 10 to extend from the surface of the semiconductor laminated body 10 and reach the substrate 100, and has a drain electrode 101 and an n-type drain semiconductor region 102. The n-type drain semiconductor region 102, which is provided between the drain electrode 101 and the semiconductor laminated body 10, covers the most part of a side face and a bottom of the drain electrode 101, and is in contact with both the drain electrode 101 and the semiconductor laminated body 10. Thus, the drain portion 100D has the n-type drain semiconductor region 102 located on its surfaces in contact with the semiconductor laminated body 10. The n-type drain semiconductor region 102 is formed by forming a trench for forming the drain portion 100D, and then introducing n-type impurities into a side wall and a bottom of the trench, using an oblique ion implantation technique.

Each of the gate portions 100G is formed through the semiconductor laminated body 10 to extend from the surface of the semiconductor laminated body 10 and reach the substrate 100, and has a gate electrode 103 and a p-type gate semiconductor region 104. The p-type gate semiconductor region 104, which is provided between the gate electrode 103 and the semiconductor laminated body 10, covers the most part of side faces and a bottom of the gate electrode 103, and is in contact with both the gate electrode 103 and the semiconductor laminated body 10. Thus, the gate portion 100G has the p-type gate semiconductor region 104 located on its surfaces in contact with the semiconductor laminated body 10. The p-type gate semiconductor region 104 is formed by forming a trench for forming the gate portion 100G, and then introducing p-type impurities into side walls and bottom of the trench, using the oblique ion implantation technique.

The source portion 100S is formed through the semiconductor laminated body 10 to extend from the surface of the semiconductor laminated body 10 and reach the substrate 100, and has a source electrode 105 and an n-type source semiconductor region 106. The n-type source semiconductor region 106, which is provided between the source electrode 105 and the semiconductor laminated body 10, covers the most part of a side face and a bottom of the source electrode 105, and is in contact with both the source electrode 105 and the semiconductor laminated body 10. Thus, the source portion 100S has the n-type source semiconductor region 106 located on its surfaces in contact with the semiconductor laminated body 10. The n-type source semiconductor region 106 is formed by forming a trench for forming the source portion 100S, and then introducing n-type impurities into a side wall and a bottom of the trench, using the oblique ion implantation technique.

The semiconductor device 10A further includes a drain-side insulating region 202, gate-side insulating regions 204, and source-side insulating region 206. These insulating regions 202, 204, 206 are in the form of voids.

The drain-side insulating region 202 is formed by etching a part of the hole supply layer 12 and a part of the n-type drain semiconductor region 102, and is formed between the hole supply layer 12 and the drain electrode 101 of the drain portion 100D. With the drain-side insulating region 202 thus provided, no two-dimensional hole gas layer (2DHG) is produced in the channel layer 13 adjacent to the drain-side insulating region 202, and p-n junction is not formed between the two-dimensional hole gas layer and the n-type drain semiconductor region 102. The drain-side insulating region 202 may be replaced with another alternative means, provided that the two-dimensional hole gas layer and the n-type drain semiconductor region 102 do not directly contact with each other. For example, an insulator, or an insulating or semi-insulating high-resistance semiconductor of a material that does not give rise to a two-dimensional hole gas layer may be formed in a region corresponding to the drain-side insulating region 202. Alternatively, a void, insulator, or insulating or semi-insulating high-resistance semiconductor may be formed at a position between the two-dimensional hole gas layer and the n-type drain semiconductor region 102.

Each of the gate-side insulating regions 204 is formed by etching a part of the electron supply layer 14 and a part of the p-type gate semiconductor region 104, and is formed between the electron supply layer 14 and the gate electrode 103 of the gate portion 100G. With the gate-side insulating region 204 thus provided, no two-dimensional electron gas layer is produced in the channel layer 13 adjacent to the gate-side insulating region 204, and p-n junction is not formed between the two-dimensional electron gas layer and the p-type gate semiconductor region 104. The gate-side insulating region 204 may be replaced with another alternative means, provided that the two-dimensional electron gas layer and the p-type gate semiconductor region 104 do not directly contact with each other. For example, an insulator, or an insulating or semi-insulating high-resistance semiconductor of a material that does not give rise to a two-dimensional electron gas layer may be formed in a region corresponding to the gate-side insulating region 204. Alternatively, a void, insulator, or insulating or semi-insulating high-resistance semiconductor may be formed at a position between the two-dimensional electron gas layer and the p-type gate semiconductor region 104.

The source-side insulating region 206 is formed by etching a part of the hole supply layer 12 and a part of the n-type source semiconductor region 106, and is formed between the hole supply layer 12 and the source electrode 105 of the source portion 100S. With the source-side insulating region 206 thus provided, no two-dimensional hole gas layer is produced in the channel layer 13 adjacent to the source-side insulating region 206, and p-n junction is not formed between the two-dimensional hole gas layer and the n-type source semiconductor region 106. The source-side insulating region 206 may be replaced with another alternative means, provided that the two-dimensional hole gas layer and the n-type source semiconductor region 106 do not directly contact with each other. For example, an insulator, or an insulating or semi-insulating high-resistance semiconductor of a material that does not give rise to a two-dimensional hole gas layer may be formed in a region corresponding to the source-side insulating region 206. Alternatively, a void, insulator, or insulating or semi-insulating high-resistance semiconductor may be formed at a position between the two-dimensional hole gas layer and the n-type source semiconductor region 106.

The drain-side insulating region 202, gate-side insulating regions 204, and source-side insulating region 206 may be formed through the following process. Initially, trenches that extend from the surface of the semiconductor laminated body 10 through the second barrier layer 15 and reach the electron supply layer 14 are formed, as parts of the trenches for forming the drain portion 100D, gate portions 100G, and source portion 100S, using an etchant A (e.g., a mixture of sulfuric acid and hydrogen peroxide solution) with which GaAs and AlGaAs can be etched. Then, after filling the trenches for the drain portion 100D and the source portion 100S with protective films, the electron supply layer 14 is selectively etched, using an etchant B (e.g., hydrochloric acid) having a higher etching rate for InGaP than for GaAs and AlGaAs, to thus form the gate-side insulating regions 204. The lateral width of each gate-side insulating region 204 is several μm. Then, after removing the protective films filling the trenches for the drain portion 100D and the source portion 100S, the trenches are further made deeper so as to extend through the channel layer 13 and reach the hole supply layer 12. Then, after filling the trenches for the gate portions 100G with protective films, the hole supply layer 12 is selectively etched, using the etchant B, so that the drain-side insulating region 202 and the source-side insulating region 206 are formed. The lateral width of each of the drain-side insulating region 202 and the source-side insulating region 206 is several μm. In this manner, in the process of forming the drain portion 100D, gate portions 100G, and source portion 100S, the drain-side insulating region 202, gate-side insulating regions 204, and source-side insulating region 206 can be formed. The drain portion 100D gate portions 100G, and source portion 100S may be further formed through the next process. After removing the protective films filling the trenches for the gate portions 100G, the trenches are made even deeper so as to extend through the first barrier layer 11 and reach the substrate 100. Then, after the n-type drain semiconductor region 102, p-type gate semiconductor regions 104, and n-type source semiconductor region 106 are formed, using the oblique ion implantation technique, as described above, the drain electrode 101, gate electrodes 103, and source electrode 105 are formed in the trenches, by a sputtering method or a vapor deposition method.

Next, operation of the semiconductor device 10A will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10A is placed in the ON state. At this time, holes are supplied from the hole supply layer 12, to the channel layer 13 side of the heterojunction interface between the hole supply layer 12 and the channel layer 13, to form a two-dimensional hole gas layer. On the other hand, electrons are supplied from the electron supply layer 14, to the channel layer 13 side of the heterojunction interface between the channel layer 13 and the electron supply layer 14, to form a two-dimensional electron gas layer. In the semiconductor device 10A, the drain portion 100D and the source portion 100S are electrically connected with each other via the two-dimensional electron gas layer in the semiconductor laminated body 10. Thus, the semiconductor device 10A can provide low ON-resistance, since current flows through the two-dimensional electron gas layer.

When a positive voltage is applied to the drain electrode 101 of the drain portion 100D, and the source electrode 105 of the source portion 100S is grounded, while a negative voltage is applied to the gate electrode 103 of each gate portion 100G the semiconductor device 10A is placed in the OFF state. The p-type gate semiconductor region 104 of each of the gate portions 100G is in ohmic contact with the two-dimensional hole gas layer in the semiconductor laminated body 10. Therefore, the potential of the two-dimensional hole gas layer in the semiconductor laminated body 10 can vary in accordance with the potential applied to the gate electrode 103 of the gate portion 100G. In this case, since a negative voltage is applied to the gate portion 100G, a negative voltage is applied to the two-dimensional hole gas layer in the semiconductor laminated body 10. As a result, the two-dimensional hole gas layer and two-dimensional electron gas layer in the semiconductor laminated body 10 are depleted. When the two-dimensional hole gas layer and the two-dimensional electron gas layer are depleted, positive fixed charge remains in the electron supply layer 14, and negative fixed charge remains in the hole supply layer 12, so that an electric field between these fixed charges is generated in a direction perpendicular to the direction that connects the drain portion 100D with the source portion 100S. Thus, the semiconductor device 10A has the heterojunction type superjunction structure, and the strength of the electric field between the drain portion 100D and the source portion 100S can be made uniform. In particular, the strength of electric field in a drift region between the drain portion 100D and the gate portion 100G can be made uniform, so that the semiconductor device 10A can exhibit a high breakdown voltage characteristic.

Further, in the semiconductor device 10A, the p-type gate semiconductor region 104 of each gate portion 100G is insulated by the gate-side insulating region 204, from the two-dimensional electron gas layer in the semiconductor laminated body 10. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layer. In other words, even when a negative voltage required to favorably deplete the two-dimensional hole gas layer and two-dimensional electron gas layer in the semiconductor laminated body 10 is applied to the gate electrode 103 of the gate portion 100G, insulation leakage is less likely or unlikely to occur between the p-type gate semiconductor region 104 of the gate portion 100G and the two-dimensional electron gas layer. Therefore, the two-dimensional hole gas layer and two-dimensional electron gas layer in the semiconductor laminated body 10 are favorably depleted, and the semiconductor device 10A can exhibit a high breakdown voltage characteristic.

Further, in the semiconductor device 10A, the n-type drain semiconductor region 102 of the drain portion 100D is insulated by the drain-side insulating region 202 from the two-dimensional hole gas layer in the semiconductor laminated body 10, and the n-type source semiconductor region 106 of the source portion 100S is insulated by the source-side insulating region 206 from the two-dimensional hole gas layer in the semiconductor laminated body 10. Therefore, insulation leakage is less likely or unlikely to occur between the n-type drain semiconductor region 102 of the drain portion 100D and the two-dimensional hole gas layer, and between the n-type source semiconductor region 106 of the source portion 100S and the two-dimensional hole gas layer, and the semiconductor device 10A can exhibit a high breakdown voltage characteristic.

Also, in the semiconductor device 10A, the thickness of the first barrier layer 11 and the thickness of the second barrier layer 15 are adjusted to be smaller than the distance between the two-dimensional electron gas layer and the two-dimensional hole gas layer. With this arrangement, the whole of the semiconductor laminated body 10, namely, the pair of two-dimensional carrier gas layers and carriers between these layers are favorably depleted, and the semiconductor device 10A can exhibit a high breakdown voltage characteristic.

Second Example

Figure 7:
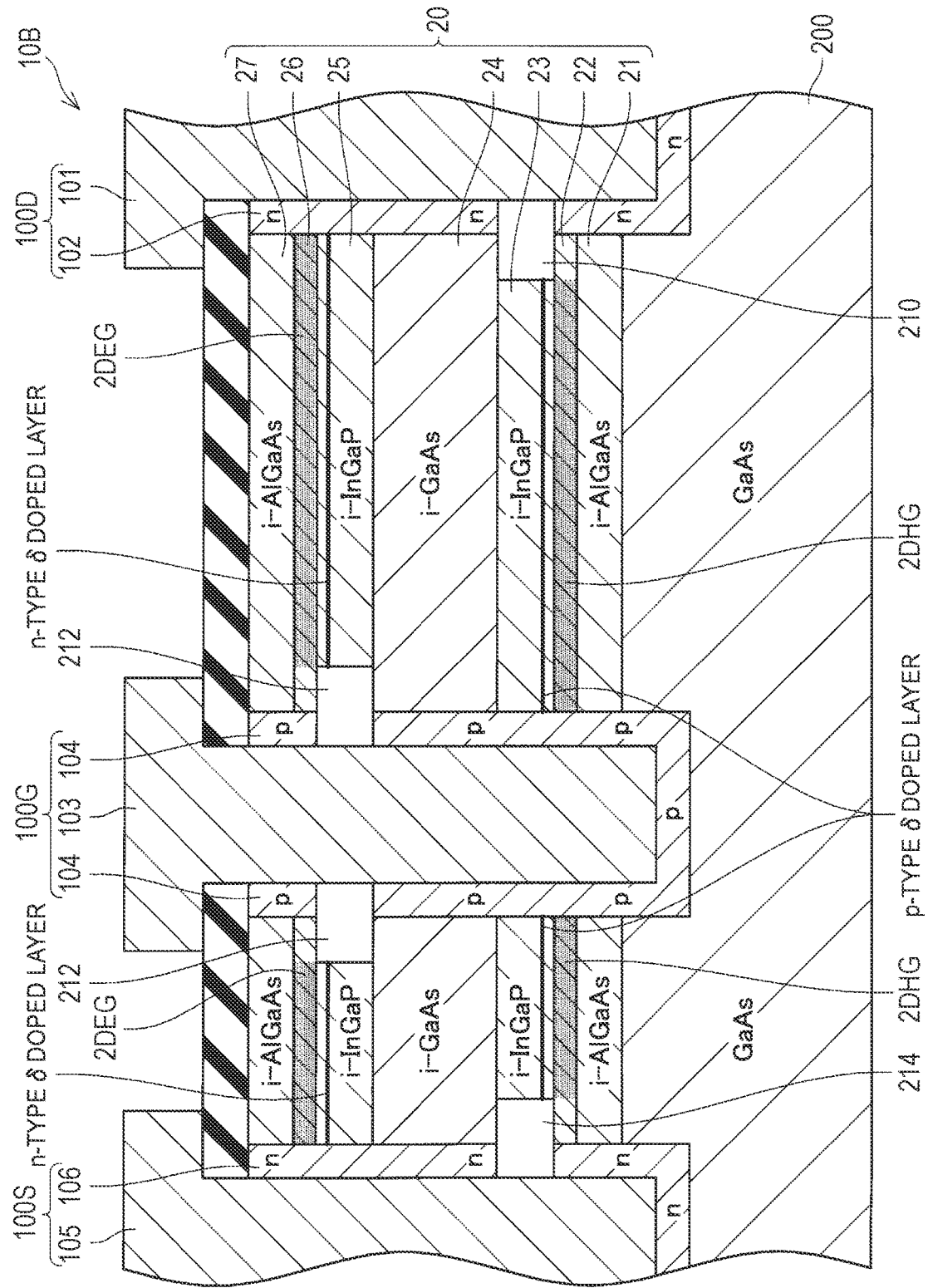
FIG. 7 is a cross-sectional view schematically showing a principal part of a semiconductor device of a second example.

FIG. 7 shows a semiconductor device 10B of a second embodiment. The semiconductor device 10B includes a substrate 200, semiconductor laminated body 20, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 20, like the gate portions 1G of FIG. 3 and FIG. 4.

The substrate 200 is a semi-insulating GaAs substrate. The substrate 200 may include a buffer layer of a GaAs-based semiconductor, for improvement of the crystalline nature of the semiconductor laminated body 20.

The semiconductor laminated body 20 is located between the drain portion 100D and the source portion 100S, and has a first barrier layer 21 of i-AlGaAs, p-channel quantum well layer 22 of i-GaAs, hole supply layer 23 of i-InGaP, channel layer 24 of i-GaAs, electron supply layer 25 of i-InGaP, n-channel quantum well layer 26 of i-GaAs, and second barrier layer 27 of i-AlGaAs. In the hole supply layer 23, a p-type δ doped layer containing p-type impurities is formed at a position adjacent to the p-channel quantum well layer 22. In the electron supply layer 25, an n-type δ doped layer containing n-type impurities is formed at a position adjacent to the n-channel quantum well layer 26. The first barrier layer 21, p-channel quantum well layer 22, hole supply layer 23, channel layer 24, electron supply layer 25, n-channel quantum well layer 26, and second barrier layer 27 are grown and formed in this order from a surface of the substrate 200, by the metal organic chemical vapor deposition method.

The semiconductor device 10B further includes a drain-side insulating region 210, gate-side insulating regions 212, and a source-side insulating region 214. These insulating regions 210, 212, 214 are in the for of voids.

The drain-side insulating region 210 is formed by etching a part of the hole supply layer 23 and a part of the n-type drain semiconductor region 102, and is formed between the hole supply layer 23 and the drain electrode 101 of the drain portion 100D. With the drain-side insulating region 210 thus provided, no two-dimensional hole gas layer (2DHG) is produced in the p-channel quantum well layer 22 adjacent to the drain-side insulating region 210, and p-n junction is not formed between the two-dimensional hole gas layer and the n-type drain semiconductor region 102. The drain-side insulating region 210 may be replaced with another alternative means, provided that the two-dimensional hole gas layer and the n-type drain semiconductor region 102 do not directly contact with each other. For example, an insulator, or an insulating or semi-insulating high-resistance semiconductor of a material that does not give rise to a two-dimensional hole gas layer may be formed in a region corresponding to the drain-side insulating region 210. Alternatively, a void, insulator, or insulating or semi-insulating high-resistance semiconductor may be formed at a position between the two-dimensional hole gas layer and the n-type drain semiconductor region 102.

Each of the gate-side insulating regions 212 is formed by etching a part of the electron supply layer 25 and a part of the p-type gate semiconductor region 104, and is formed between the electron supply layer 25 and the gate electrode 103 of the gate portion 100G. With the gate-side insulating region 212 thus provided, no two-dimensional electron gas layer is produced in the n-channel quantum well layer 26 adjacent to the gate-side insulating region 212, and p-n junction is not formed between the two-dimensional electron gas layer and the p-type gate semiconductor region 104. The gate-side insulating region 212 may be replaced with another alternative means, provided that the two-dimensional electron gas layer and the p-type gate semiconductor region 104 do not directly contact with each other. For example, an insulator, or an insulating or semi-insulating high-resistance semiconductor of a material that does not give rise to a two-dimensional electron gas layer may be formed in a region corresponding to the gate-side insulating region 212. Alternatively, a void, insulator, or insulating or semi-insulating high-resistance semiconductor may be formed at a position between the two-dimensional electron gas layer and the p-type gate semiconductor region 104.

The source-side insulating region 214 is formed by etching a part of the hole supply layer 23 and a part of the n-type source semiconductor region 106, and is formed between the hole supply layer 23 and the source electrode 105 of the source portion 100S. With the source-side insulating region 214 thus provided, no two-dimensional hole gas layer is produced in the p-channel quantum well layer 22 adjacent to the source-side insulating region 214, and p-n junction is not formed between the two-dimensional hole gas layer and the n-type source semiconductor region 106. The source-side insulating region 214 may be replaced with another alternative means, provided that the two-dimensional hole gas layer and the n-type source semiconductor region 106 do not directly contact with each other. For example, an insulator, or an insulating or semi-insulating high-resistance semiconductor of a material that does not give rise to a two-dimensional hole gas layer may be formed in a region corresponding to the source-side insulating region 214. Alternatively, a void, insulator, or insulating or semi-insulating high-resistance semiconductor may be formed at a position between the two-dimensional hole gas layer and the n-type source semiconductor region 106.

The drain-side insulating region 210, gate-side insulating regions 212, and source-side insulating region 214 may be formed through the following process. Initially, trenches that extend from the surface of the semiconductor laminated body 20 through the second barrier layer 27 and the n-channel quantum well layer 26 and reach the electron supply layer 25 are formed, as parts of the trenches for forming the drain portion 100D, gate portions 100G, and source portion 100S, using an etchant A (e.g., a mixture of sulfuric acid and hydrogen peroxide solution) with which GaAs and AlGaAs can be etched. Then, after filling the trenches for the drain portion 100D and the source portion 100S with protective films, the electron supply layer 25 is selectively etched, using an etchant B (e.g., hydrochloric acid) having a higher etching rate for InGaP than for GaAs and AlGaAs, to thus form the gate-side insulating regions 212. The lateral width of the gate side insulating region 212 is several μm. Then, after removing the protective films filling the trenches fir the drain portion 100D and the source portion 100S, the trenches are further made deeper so as to extend through the channel layer 24 and reach the hole supply layer 23, using the etchant A. Then, after filling the trenches for the gate portions 100G with protective films, the hole supply layer 23 is selectively etched, using the etchant B, so that the drain-side insulating region 210 and the source-side insulating region 214 are formed. The lateral width of each of the drain-side insulating region 210 and the source-side insulating region 214 is several μm. In this manner, in the process of forming the drain portion 100D, gate portions 100G, and source portion 100S, the drain-side insulating region 210, gate-side insulating regions 212, and source-side insulating region 214 can be formed. The drain portion 100D, gate portions 100G, and source portion 100S may be further formed through the next process. After removing the protective films filling the trenches for the gate portions 100G, the trenches are made even deeper so as to extend through the p-channel quantum well layer 22 and first barrier 21 and reach the substrate 200, using the etchant A. Then, after the n-type drain, semiconductor region 102, p-type gate semiconductor regions 104, and n-type source semiconductor region 106 are formed, using the oblique ion implantation technique, as described above, the drain electrode 101, gate electrodes 103, and source electrode 105 are formed in the trenches, by the sputtering method or vapor deposition method.

Next, operation of the semiconductor device 10B will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10B is placed in the ON state. At this time, holes are supplied from the p-type σ doped layer of the hole supply layer 23, to the p-channel quantum well layer 22 side of the heterojunction interface between the p-channel quantum well layer 22 and the hole supply layer 23, to form a two-dimensional hole gas layer. On the other hand, electrons are supplied from the n-type δ doped layer of the electron supply layer 25, to the n-channel quantum well layer 26 side of the heterojunction interface between the electron supply layer 25 and the n-channel quantum well layer 26, to form a two-dimensional electron gas layer. In the semiconductor device 10B, the drain portion 100D and the source portion 100S are electrically connected with each other via the two-dimensional electron gas layer in the semiconductor laminated body 20. Thus, the semiconductor device 10B can provide low ON-resistance, since current flows through the two-dimensional electron gas layer.

When a positive voltage is applied to the drain electrode 101 of the drain portion 100D, and the source electrode 105 of the source portion 100S is grounded, while a negative voltage is applied to the gate electrode 103 of each gate portion 100G, the semiconductor device 10B is placed in the OFF state. The p-type gate semiconductor region 104 of each of the gate portions 100G is in ohmic contact with the two-dimensional hole gas layer in the semiconductor laminated body 20. Therefore, the potential of the two-dimensional hole gas layer in the semiconductor laminated body 20 can vary in accordance with the potential applied to the gate electrodes 103 of the gate portions 100G. In this case, since a negative voltage is applied to the gate portion 100G, a negative voltage is applied to the two-dimensional hole gas layer in the semiconductor laminated body 20. As a result, the two-dimensional hole gas layer and the two-dimensional electron gas layer in the semiconductor laminated body 20 are depleted. When the two-dimensional hole gas layer and the two-dimensional electron gas layer are depleted, positive fixed charge remains in a region where the two-dimensional electron gas layer is depleted, and negative fixed charge remains in a region where the two-dimensional hole gas layer is depleted, so that an electric field between these fixed charges is generated in a direction perpendicular to the direction that connects the drain portion 100D with the source portion 100S. Thus, the semiconductor device 10B has a heterojunction type superjunction structure, and the strength of the electric field between the drain portion 100D and the source portion 100S can be made uniform. In particular, the strength of the electric field in a drift region between the drain portion 100D and the gate portion 100G can be made uniform, so that the semiconductor device 10B can exhibit a high breakdown voltage characteristic.

Further, in the semiconductor device 10B, the p-type gate semiconductor region 104 of each gate portion 100G is insulated by the gate-side insulating region 212, from the two-dimensional electron gas layer in the semiconductor laminated body 20. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layer. In other words, even when a negative voltage required to favorably deplete the two-dimensional hole gas layer and two-dimensional electron gas layer in the semiconductor laminated body 20 is applied to the gate electrode 103 of the gate portion 100G, insulation leakage is less likely or unlikely to occur between the p-type gate semiconductor region 104 of the gate portion 100G and the two-dimensional electron gas layer. Therefore, the two-dimensional hole gas layer and two-dimensional electron gas layer in the semiconductor laminated body 20 are favorably depleted, and the semiconductor device 10B can exhibit a high breakdown voltage characteristic.

Further, in the semiconductor device 10B, the n-type drain semiconductor region 102 of the drain portion 100D is insulated by the drain-side insulating region 210, from the two-dimensional hole gas layer in the semiconductor laminated body 20, and the n-type source semiconductor region 106 of the source portion 100S is insulated by the source-side insulating region 214 from the two-dimensional hole gas layer in the semiconductor laminated body 20. Therefore, insulation leakage is less likely or unlikely to occur between the n-type drain semiconductor region 102 of the drain portion 100D and the two-dimensional hole gas layer, and between the n-type source semiconductor region 106 of the source portion 100S and the two-dimensional hole gas layer, and the semiconductor device 10B can exhibit a high breakdown voltage characteristic.

Also, in the semiconductor device 10B, the thickness of the first barrier layer 21 and the thickness of the second barrier layer 27 are adjusted to be smaller than the distance between the two-dimensional electron gas layer and the two-dimensional hole gas layer. With this arrangement, the whole of the semiconductor laminated body 20, namely, the pair of two-dimensional carrier gas layers and carriers between these layers are favorably depleted, and the semiconductor device 10B can exhibit a high breakdown voltage characteristic.

Also, the semiconductor device 10B is configured such that both of the two-dimensional electron gas layer and the two-dimensional hole gas layer are produced in the quantum wells. Therefore, carriers are less likely or unlikely to leak from the quantum wells, and the semiconductor device 10B can exhibit a low leakage current characteristic.

Third Example

Figure 8:
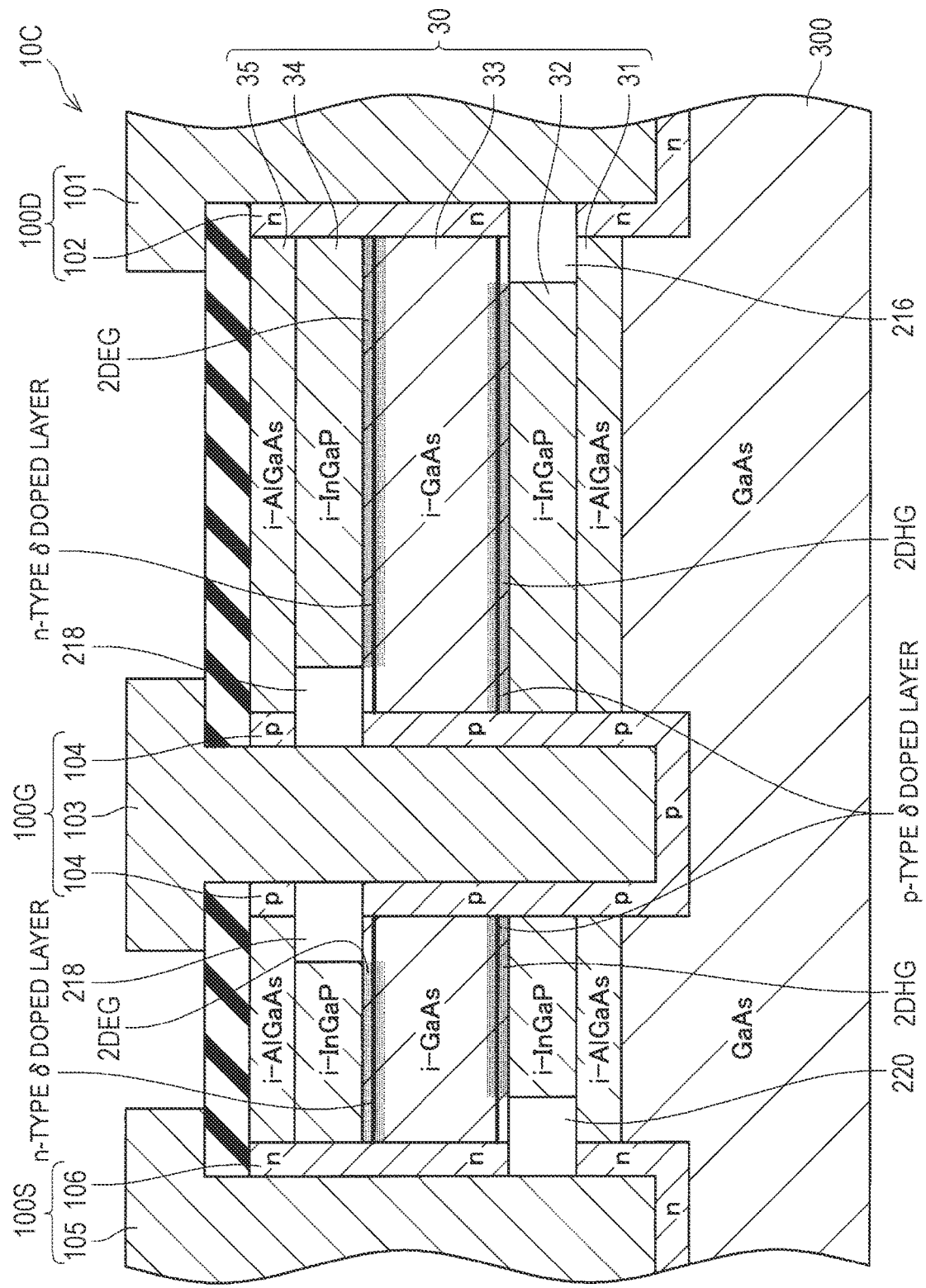
FIG. 8 is a cross-sectional view schematically showing a principal part of a semiconductor device of a third example.

FIG. 8 shows a semiconductor device 10C of a third embodiment. The semiconductor device 10C includes a substrate 300, semiconductor laminated body 30, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 30, like the gate portions 1G of FIG. 3 and FIG. 4.

The substrate 300 is a semi-insulating GaAs substrate. The substrate 300 may include a buffer layer of a GaAs-based semiconductor, for improvement of the crystalline nature of the semiconductor laminated body 30.

The semiconductor laminated body 30 is located between the drain portion 100D and the source portion 100S, and has a first barrier layer 31 of i-AlGaAs, hole supply layer 32 of i-InGaP, channel layer 33 of i-GaAs, electron supply layer 34 of i-InGaP, and second barrier layer 35 of i-AlGaAs. In the channel layer 33, a p-type δ doped layer containing p-type impurities is formed at a position adjacent to the hole supply layer 32, and n-type δ doped layer containing n-type impurities is formed at a position adjacent to the electron supply layer 34. The first barrier layer 31, hole supply layer 32, channel layer 33, electron supply layer 34, and second barrier layer 35 are grown and formed in this order from a surface of the substrate 300, by the metal organic chemical vapor deposition method.

The semiconductor device 10C further includes a drain-side insulating region 216, gate-side insulating regions 218, and source-side insulating region 220. These insulating regions 216, 218, 220 are in the form of voids.

The drain-side insulating region 216 is formed by etching a part of the hole supply layer 32 and a part of the n-type drain semiconductor region 102, and is formed between the hole supply layer 32 and the drain electrode 101 of the drain portion 100D. With the drain-side insulating region 216 thus provided, no two-dimensional hole gas layer (2DHG) is produced in the channel layer 33 adjacent to the drain-side insulating region 216, and p-n junction is not formed between the two-dimensional hole gas layer and the n-type drain semiconductor region 102. The drain-side insulating region 216 may be replaced with another alternative means, provided that the two-dimensional hole gas layer and the n-type drain semiconductor region 102 do not directly contact with each other. For example, an insulator, or an insulating or semi-insulating high-resistance semiconductor of a material that does not give rise to a two-dimensional hole gas layer may be formed in a region corresponding to the drain-side insulating region 216. Alternatively, a void, insulator, or insulating or semi-insulating high-resistance semiconductor may be formed at a position between the two-dimensional hole gas layer and the n-type drain semiconductor region 102.

Each of the gate-side insulating regions 218 is formed by etching a part of the electron supply layer 34 and a part of the p-type gate semiconductor region 104, and is formed between the electron supply layer 34 and the gate electrode 103 of the gate portion 100G. With the gate-side insulating region 218 thus provided, no two-dimensional electron gas layer (2DEG) is produced in the channel layer 33 adjacent to the gate-side insulating region 218, and p-n junction is not formed between the two-dimensional electron gas layer and the p-type gate semiconductor region 104. The gate-side insulating region 218 may be replaced with another alternative means, provided that the two-dimensional electron gas layer and the p-type gate semiconductor region 104 do not directly contact with each other. For example, an insulator, or an insulating or semi-insulating high-resistance semiconductor of a material that does not give rise to a two-dimensional electron gas layer may be formed in a region corresponding to the gate-side insulating region 218. Alternatively, a void, insulator, or insulating or semi-insulating high-resistance semiconductor may be formed at a position 110 between the two-dimensional electron gas layer and the p-type gate semiconductor region 104.

The source-side insulating region 220 is formed by etching a part of the hole supply layer 32 and a part of the n-type source semiconductor region 106, and is formed between the hole supply layer 32 and the source electrode 105 of the source portion 100S. With the source-side insulating region 220 thus provided, no two-dimensional hole gas layer is produced in the channel layer 33 adjacent to the source-side insulating region 220, and p-n junction is not formed between the two-dimensional hole gas layer and the n-type source semiconductor region 106. The source side insulating region 220 may be replaced with another alternative means, provided that the two-dimensional hole gas layer and the n-type source semiconductor region 106 do not directly contact with each other. For example, an insulator, or an insulating or semi-insulating high-resistance semiconductor of a material that does not give rise to a two-dimensional hole gas layer may be formed in a region corresponding to the source-side insulating region 220. Alternatively, a void, insulator, or insulating or semi-insulating high-resistance semiconductor may be formed at a position between the two-dimensional hole gas layer and the n-type source semiconductor region 106.

Next, operation of the semiconductor device 10C will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10C is placed in the ON state. At this time, holes are supplied froth the p-type σ doped layer of the channel layer 33, to the channel layer 33 side of the heterojunction interface between the hole supply layer 32 and the channel layer 33, to form a two-dimensional hole gas layer. On the other hand, electrons are supplied from the n-typed δ doped layer of the channel layer 33, to the channel layer 33 side of the heterojunction interface between the channel layer 33 and the electron supply layer 34, to form a two-dimensional electron gas layer. In the semiconductor device 10C, the drain portion 100D and the source portion 100S are electrically connected with each other via the two-dimensional electron gas layer in the semiconductor laminated body 30. Thus, the semiconductor device 10C can provide low ON-resistance, since current flows through the two-dimensional electron gas layer.

When a positive voltage is applied to the drain electrode 101 of the drain portion 100D, and the source electrode 105 of the source portion 100S is grounded, while a negative voltage is applied to the gate electrode 103 of each gate portion 100G, the semiconductor device 10C is placed in the OFF state. The p-type gate semiconductor region 104 of each of the gate portions 100G is in ohmic contact with the two-dimensional hole gas layer in the semiconductor laminated body 30. Therefore, the potential of the two-dimensional hole gas layer in the semiconductor laminated body 30 can vary in accordance with the potential applied to the gate electrode 103 of the gate portion 100G. In this case, since a negative voltage is applied to the gate portion 100G, a negative voltage is applied to the two-dimensional hole gas layer in the semiconductor laminated body 30. As a result, the two-dimensional hole gas layer and the two-dimensional electron gas layer in the semiconductor laminated body 30 are depleted. When the two-dimensional hole gas layer and the two-dimensional electron gas layer are depleted, positive fixed charge remains in a region where the two-dimensional electron gas layer is depleted, and negative fixed charge remains in a region where the two-dimensional hole gas layer is depleted, so that an electric field between these fixed charges is generated in a direction perpendicular to the direction that connects the drain portion 100D with the source portion 100S. Thus, the semiconductor device 10C has a heterojunction type superjunction structure, and the strength of the electric field between the drain portion 100D and the source portion 100S can be made uniform. In particular, the strength of the electric field in a drift region between the drain portion 100D and the gate portion 100G can be made uniform, so that the semiconductor device 10C can exhibit a high breakdown voltage characteristic.

Further, in the semiconductor device 10C, the p-type gate semiconductor region 104 of each gate portion 100G is insulated by the gate-side insulating region 218, from the two-dimensional electron gas layer in the semiconductor laminated body 30. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layer. In other words, even when a negative voltage required to favorably deplete the two-dimensional hole gas layer and two-dimensional electron gas layer in the semiconductor laminated body 30 is applied to the gate electrode 103 of the gate portion 100G, insulation leakage is less likely or unlikely to occur between the p-type gate semiconductor region 104 of the gate portion 100G and the two-dimensional electron gas layer. Therefore, the two-dimensional hole gas layer and two-dimensional electron gas layer in the semiconductor laminated body 30 are favorably depleted, and the semiconductor device 10C can exhibit a high breakdown voltage characteristic.

Further, in the semiconductor device 100, the n-type drain semiconductor region 102 of the drain portion 100D is insulated by the drain-side insulating region 216 from the two-dimensional hole gas layer in the semiconductor laminated body 30, and the n-type source semiconductor region 106 of the source portion 100S is insulated by the source-side insulating region 220 from the two-dimensional hole gas layer in the semiconductor laminated body 30. Therefore, insulation leakage is less likely or unlikely to occur between the n-type drain semiconductor region 102 of the drain portion 100D and the two-dimensional hole gas layer, and between the n-type source semiconductor region 106 of the source portion 100S and the two-dimensional hole gas layer, and the semiconductor device 10C can exhibit a high breakdown voltage characteristic.

Also, in the semiconductor device 10C, the thickness of the first barrier layer 31 and the thickness of the second barrier layer 35 are adjusted to be smaller than the distance between the two-dimensional electron gas layer and the two-dimensional hole gas layer. With this arrangement, the whole of the semiconductor laminated body 30, namely, the pair of two-dimensional carrier gas layers and carriers between these layers are favorably depleted, and the semiconductor device 10C can exhibit a high breakdown voltage characteristic.

Fourth Example

Figure 9:
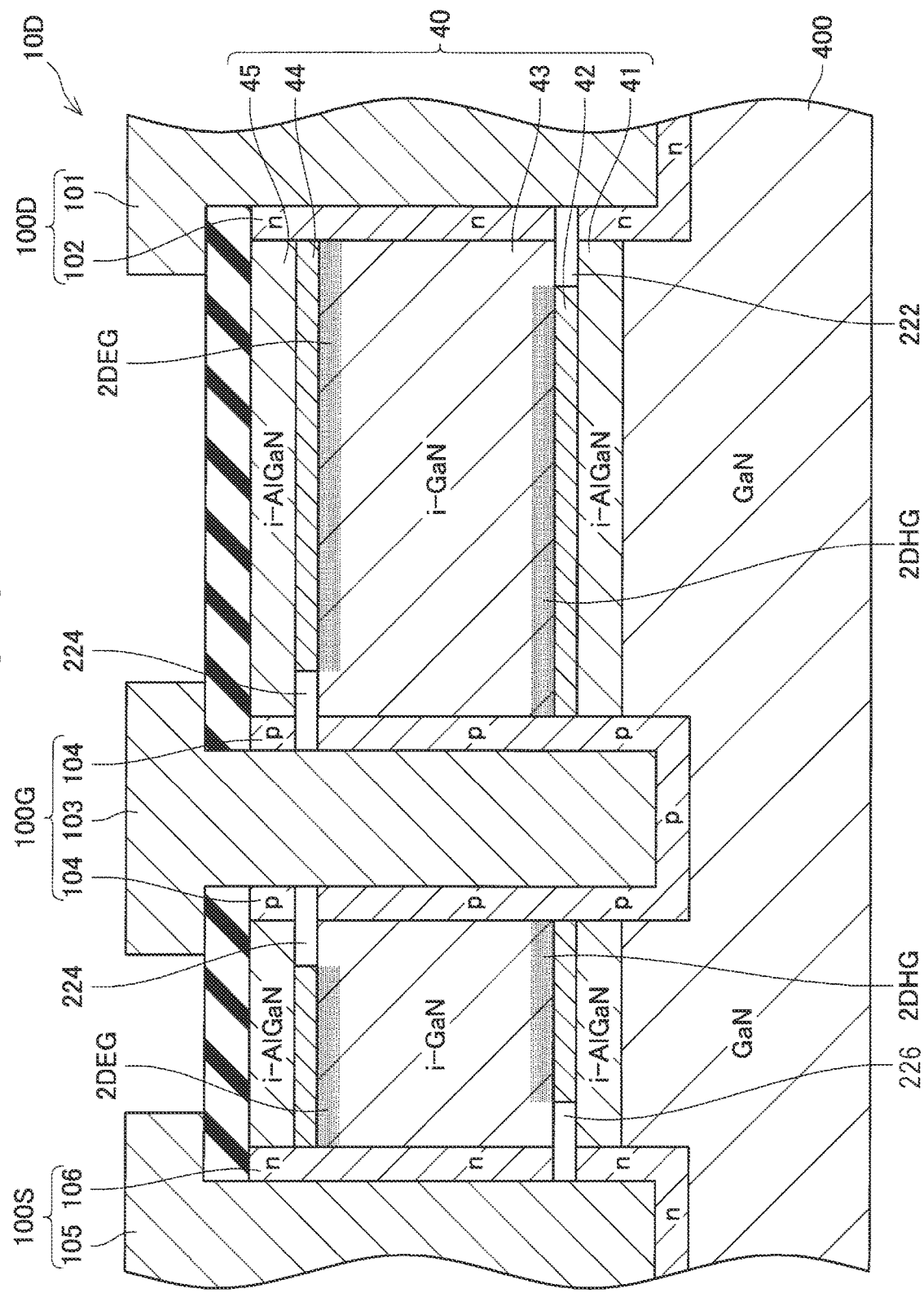
FIG. 9 is a cross-sectional view schematically showing a principal part of a semiconductor device of a fourth example.

FIG. 9 shows a semiconductor device 10D of a fourth embodiment. The semiconductor device 10D includes a substrate 400, semiconductor laminated body 40, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 40, like the gate portions 1G of FIG. 3 and FIG. 4.

The substrate 400 is a semi-insulating GaN substrate. The substrate 400 may include a buffer layer of a nitride semiconductor, for improvement of the crystalline nature of the semiconductor laminated body 40. Also, a semi-insulating Si substrate or a sapphire substrate may be used as the substrate 400, in place of the semi-insulating GaN substrate.

The semiconductor laminated body 40 is located between the drain portion 100D and the source portion 100S, and has a first barrier layer 41 of i-AlGaN, hole supply layer 42 of $p^+$-AlGaN, channel layer 43 of i-GaN, electron supply layer 44 of $n^+$-AlGaN, and second barrier layer 45 of i-AlGaN. The first barrier layer 41, hole supply layer 42, channel layer 43, electron supply layer 44, and second barrier layer 45 are grown and formed in this order from a surface of the substrate 400, by the metal organic chemical vapor deposition method.

The semiconductor device 10D further includes a drain-side insulating region 222, gate side insulating regions 224, and a source-side insulating region 226. These insulating regions 222, 224, 226 are in the form of voids.

The drain-side insulating region 222 is formed by etching a part of the hole supply layer 42 and a part of the n-type drain semiconductor region 102, and is formed between the hole supply layer 42 and the drain electrode 101 of the drain portion 100D. With the drain-side insulating region 222 thus provided, no two-dimensional hole gas layer (2DHG) is produced in the channel layer 43 adjacent to the drain-side insulating region 222, and p-n junction is not formed between the two-dimensional hole gas layer and the n-type drain semiconductor region 102. The drain-side insulating region 222 may be replaced with another alternative means, provided that the two-dimensional hole gas layer and the n-type drain semiconductor region 102 do not directly contact with each other. For example, an insulator, or an insulating or semi-insulating high-resistance semiconductor of a material that does not give rise to a two-dimensional hole gas layer may be formed in a region corresponding to the drain-side insulating region 222. Alternatively, a void, insulator, or insulating or semi-insulating high-resistance semiconductor may be formed at a position between the two-dimensional hole gas layer and the n-type drain semiconductor region 102.

Each of the gate-side insulating regions 224 is formed by etching a part of the electron supply layer 44 and a part of the p-type gate semiconductor region 104, and is formed between the electron supply layer 44 and the gate electrode 103 of the gate portion 100G. With the gate-side insulating region 224 thus provided, no two-dimensional electron gas layer (2DEG) is produced in the channel layer 33 adjacent to the gate-side insulating region 224, and p-n junction is not formed between the two-dimensional electron gas layer and the p-type gate semiconductor region 104. The gate-side insulating region 224 may be replaced with another alternative means, provided that the two-dimensional electron gas layer and the p-type gate semiconductor region 104 do not directly contact with each other. For example, an insulator, or an insulating or semi-insulating high-resistance semiconductor of a material that does not give rise to a two-dimensional electron gas layer may be formed in a region corresponding to the gate-side insulating region 224. Alternatively, a void, insulator, or insulating or semi-insulating high-resistance semiconductor may be formed at a position between the two-dimensional electron gas layer and the p-type gate semiconductor region 104.

The source-side insulating region 226 is formed by etching a part of the hole supply layer 42 and a part of the n-type source semiconductor region 106, and is formed between the hole supply layer 42 and the source electrode 105 of the source portion 100S. With the source-side insulating region 226 thus provided, no two-dimensional hole gas layer is produced in the channel layer 43 adjacent to the source-side insulating region 226, and p-n junction is not formed between the two-dimensional hole gas layer and the n-type source semiconductor region 106. The source-side insulating region 226 may be replaced with another alternative means, provided that the two-dimensional hole gas layer and the n-type source semiconductor region 106 do not directly contact with each other. For example, insulator, or an insulating or semi-insulating high-resistance semiconductor of a material that does not give rise to a two-dimensional hole gas layer may be formed in a region corresponding to the source-side insulating region 226. Alternatively, a void, insulator, or insulating or semi-insulating high-resistance semiconductor may be formed at a position between the two-dimensional hole gas layer and the n-type source semiconductor region 106.

Next, operation of the semiconductor device 10D will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10D is placed in the ON state. At this time, the hole supply layer 42 is polarized such that negative fixed charge is induced at an interface on the channel layer 43 side, through spontaneous polarization and piezoelectric polarization. Since holes are induced due to polarization charge of the hole supply layer 42, and holes are supplied from acceptor impurities of the hole supply layer 42, a two-dimensional hole gas layer is produced on the channel layer 43 side of the heterojunction interface between the hole supply layer 42 and the channel layer 43. On the other hand, the electron supply layer 44 is polarized such that positive fixed charge is induced at an interface on the channel layer 43 side, through spontaneous polarization and piezoelectric polarization. Since electrons are induced due to polarization charge of the electron supply layer 44, and electrons are supplied from donor impurities of the electron supply layer 44, a two-dimensional electron gas layer is produced on the chats el layer 43 side of the heterojunction interface between the channel layer 43 and the electron supply layer 44. In the semiconductor device 10D, the drain portion 100D and the source portion 100S are electrically connected with each other via the two-dimensional electron gas layer in the semiconductor laminated body 40. Thus, the semiconductor device 10D can provide low ON-resistance, since current flows through the two-dimensional electron gas layer.

When a positive voltage is applied to the drain electrode 101 of the drain portion 100D, and the source electrode 105 of the source portion 100S is grounded, while a negative voltage is applied to the gate electrodes 103 of the gate portions 100G, the semiconductor device 10D is placed in the OFF state. The p-type gate semiconductor region 104 of each gate portion 100G is in ohmic contact with the two-dimensional hole gas layer in the semiconductor laminated body 40. Therefore, the potential of the two-dimensional hole gas layer in the semiconductor laminated body 40 can vary in accordance with the potential applied to the gate electrode 103 of the gate portion 100G. In this case, since a negative voltage is applied to the gate portion 100G, a negative voltage is applied to the two-dimensional hole gas layer in the semiconductor laminated body 40. As a result, the two-dimensional hole gas layer and two-dimensional electron gas layer in the semiconductor laminated body 40 are depleted. When the two-dimensional hole gas layer and the two-dimensional electron gas layer are depleted, positive fixed charge of the electron supply layer 44 and negative fixed charge of the hole supply layer 42 remain, so that an electric field between these fixed charges is generated in the direction perpendicular to the direction that Connects the drain portion 100D with the source portion 100S. Thus, the semiconductor device 10D has a heterojunction type superjunction structure, and the strength of the electric field between the drain portion 100D and the source portion 100S can be made uniform. In particular, the strength of the electric field in a drift region between the drain portion 100D and the gate portion 100G can be made uniform, so that the semiconductor device 10D can exhibit a high breakdown voltage characteristic.

Further, in the semiconductor device 10D, the p-type gate semiconductor region 104 of each gate Portion 100G is insulated by the gate-side insulating region 224, from the two-dimensional electron gas layer in the semiconductor laminated body 40. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layer. In other words, even when a negative voltage required to favorably deplete the two-dimensional hole gas layer and two-dimensional electron gas layer in the semiconductor laminated body 40 is applied to the gate electrode 103 of the gate portion 100G insulation leakage is less likely or unlikely to occur between the p-type gate semiconductor region 104 of the gate portion 100G and the two-dimensional electron gas layer. Therefore, the two-dimensional hole gas layer and two-dimensional electron gas layer in the semiconductor laminated body 40 are favorably depleted, and the semiconductor device 10D can exhibit a high breakdown voltage characteristic.

Further, in the semiconductor device 10D, the n-type drain semiconductor region 102 of the drain portion 100D is insulated by the drain-side insulating region 222, from the two-dimensional hole gas layer in the semiconductor laminated body 40, and the n-type source semiconductor region 106 of the source portion 100S is insulated by the source-side insulating region 226 from the two-dimensional hole gas layer in the semiconductor laminated body 40. Therefore, insulation leakage is less likely or unlikely to occur between the n-type drain semiconductor region 102 of the drain portion 100D and the two-dimensional hole gas layer, and between the n-type source semiconductor region 106 of the source portion 100S and the two-dimensional hole gas layer, and the semiconductor device 10D can exhibit a high breakdown voltage characteristic.

Also, in the semiconductor device 10D, the thickness of the first barrier layer 41 and the thickness of the second barrier layer 45 are adjusted to be smaller than the distance between the two-dimensional electron gas layer and the two-dimensional hole gas layer. With this arrangement, the whole of the semiconductor laminated body 40, namely, the pair of two-dimensional carrier gas layers and carriers between these layers are favorably depleted, and the semiconductor device 100 can exhibit a high breakdown voltage characteristic.

Fifth Example

Figure 10:
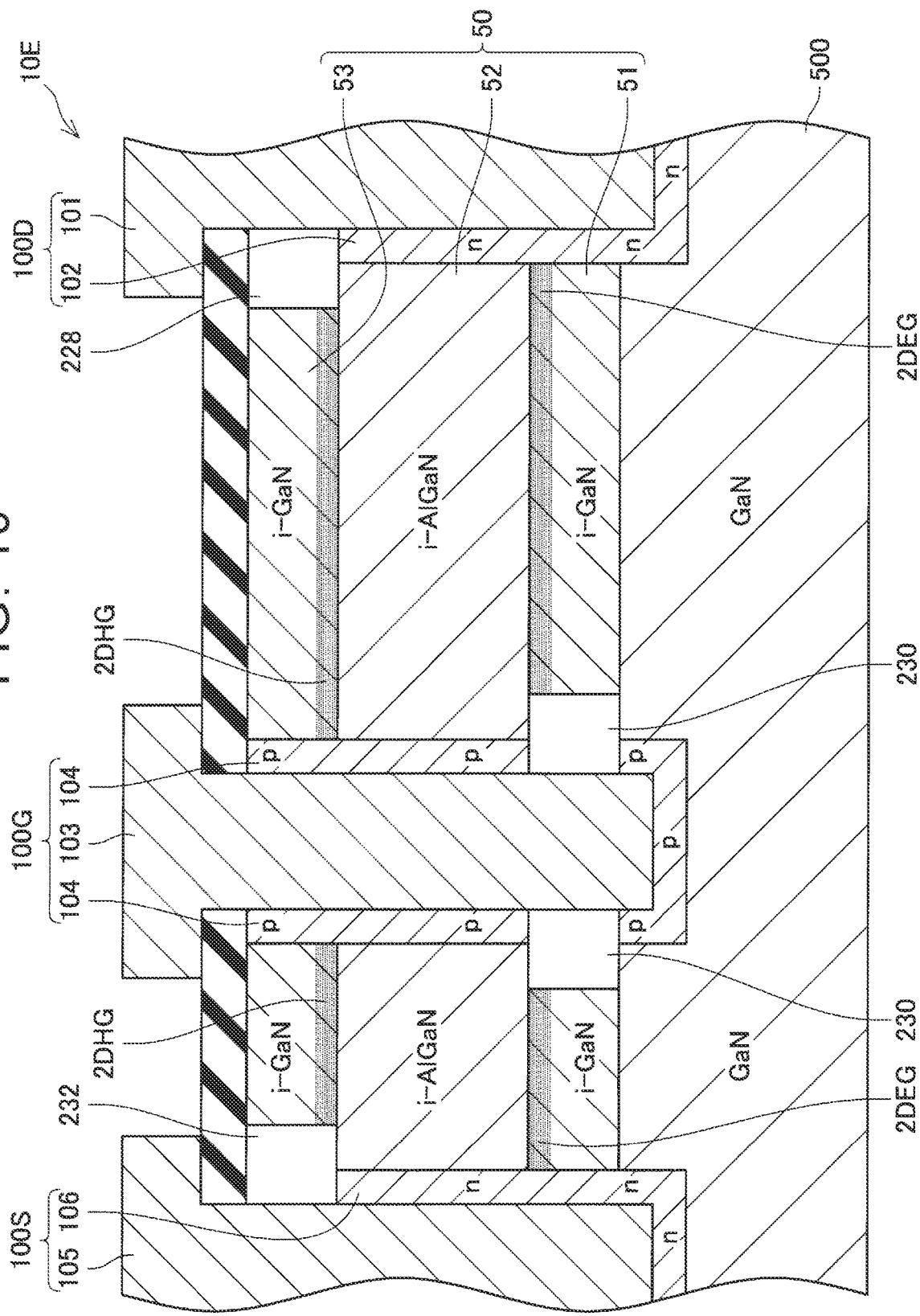
FIG. 10 is a cross-sectional view schematically showing a principal part of a semiconductor device of a fifth example.

FIG. 10 shows a semiconductor device 10E of a fifth embodiment. The semiconductor device 10E includes a substrate 500, semiconductor laminated body 50, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 50, like the gate portions 1G of FIG. 3 and FIG. 4.

The substrate 500 is a semi-insulating GaN substrate. The substrate 500 may include a buffer layer of a nitride semiconductor, for improvement of the crystalline nature of the semiconductor laminated body 50. Also, a semi-insulating Si substrate or a sapphire substrate may be used as the substrate 500, in place of the semi-insulating GaN substrate.

The semiconductor laminated body 50 is located between the drain portion 100D and the source portion 100S, and has an n-channel layer 51 of i-GaN, barrier layer 52 of i-AlGaN, and p-channel layer 53 of i-GaN. The n-channel layer 51, barrier layer 52, and p-channel layer 53 are grown and formed in this order from a surface of the substrate 500, by the metal organic chemical vapor deposition method.

The semiconductor device 10E further includes a drain-side insulating region 228, gate-side insulating regions 230, and a source-side insulating region 232. These insulating regions 228, 230, 232 are in the form of voids.

The drain-side insulating region 228 is formed by etching a part of the p-channel layer 53 and a part of the n-type drain semiconductor region 102, and is formed between the p-channel layer 53 and the drain electrode 101 of the drain portion 100D. With the drain-side insulating region 228 thus provided, p-n junction is not formed between the two-dimensional hole gas layer (2DHG) the p-channel layer 53 and the n-type drain semiconductor region 102. The drain-side insulating region 228 may be replaced with another alternative means, provided that the two-dimensional hole gas layer and the n-type drain semiconductor region 102 do not directly contact with each other. For example, an insulator, or an insulating or semi-insulating high-resistance semiconductor may be formed, in place of the void, in a region corresponding to the drain-side insulating region 228. Alternatively, when the p-channel layer 53 and the n-type drain semiconductor region 102 are formed in the region corresponding to the drain-side insulating region 228, a void, insulator, or insulating or semi-insulating high-resistance semiconductor of a material that does not give rise to a two-dimensional hole gas layer may be formed in the barrier layer 52 adjacent to the region corresponding to the drain-side insulating region 228.

Each of the gate-side insulating regions 230 is formed by etching a part of the n-channel layer 51 and a part of the p-type gate semiconductor region 104, and is formed between the n-channel layer 51 and the gate electrode 103 of the gate portion 100G. With the gate-side insulating region 230 thus provided, p-n junction is not formed between a two-dimensional electron gas layer (2DEG) in the n-channel layer 51 and the p-type gate semiconductor region 104. The gate-side insulating region 230 may be replaced with another alternative means, provided that the two-dimensional electron gas layer and the p-type gate semiconductor region 104 do not directly contact with each other. For example, an insulator, or an insulating or semi-insulating high-resistance semiconductor may be formed, in place of the void, in a region corresponding to the gate-side insulating region 230. Alternatively, when the n-channel layer 51 and the p-type gate semiconductor region 104 are formed in the region corresponding to the gate-side insulating region 230, a void, an insulator, or insulating or semi-insulating high-resistance semiconductor of a material that does not give rise to a two-dimensional electron gas layer may be formed in the barrier layer 52 adjacent to the region corresponding to the gate-side insulating region 230.

The source-side insulating region 232 is formed by etching a part of the p-channel layer 53 and a part of the n-type source semiconductor region 106, and is formed between the p-channel layer 53 and the source electrode 105 of the source portion 100S. With the source-side insulating region 232 thus provided, p-n junction is not formed between the two-dimensional hole gas layer in the p-channel layer 53 and the n-type source semiconductor region 106. The source-side insulating region 232 may be replaced with another alternative means, provided that the two-dimensional hole gas layer and the n-type source semiconductor region 106 do not directly contact with each other. For example, an insulator, or an insulating or semi-insulating high-resistance semiconductor may be formed in place of the void, in a region corresponding to the source-side insulating region 232. Alternatively, when the p-channel layer 53 and the n-type source semiconductor region 106 are formed in the region corresponding to the source-side insulating region 232, a void, an insulator, or insulating or semi-insulating high-resistance semiconductor of a material that does not give rise to a two-dimensional hole gas layer may be formed in the barrier layer 52 adjacent to the region corresponding to source-side insulating region 232.

Next, operation of the semiconductor device 10E will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10E is placed in the ON state. At this time, the barrier layer 52 is polarized such that positive fixed charge is induced at an interface closer to the n-channel layer 51, and negative fixed charge is induced at an interface closer to the p-channel layer 53, through spontaneous polarization and piezoelectric polarization. Through the polarizing operation of the barrier layer 52, a two-dimensional electron gas layer is produced on the n-channel layer 51 side of the heterojunction interface between the n-channel layer 51 and the barrier layer 52, and a two-dimensional hole gas layer is produced on the p-channel layer 53 side of the heterojunction interface between the barrier layer 52 and the p-channel layer 53. In the semiconductor device 10E, the drain portion 100D and the source portion 100S are electrically connected with each other via the two-dimensional electron gas layer in the semiconductor laminated body 50. Thus, the semiconductor device 10E can provide low ON-resistance, since current flows through the two-dimensional electron gas layer.

When a positive voltage is applied to the drain electrode 101 of the drain portion 100D, and the source electrode 105 of the source portion 100S is grounded, while a negative voltage is applied to the gate electrode 103 of each gate portion 100G, the semiconductor device 10E is placed in the OFF state. The p-type gate semiconductor region 104 of each gate portion 100G is in ohmic contact with the two-dimensional hole gas layer in the semiconductor laminated body 50. Therefore, the potential of the two-dimensional hole gas layer in the semiconductor laminated body 50 can vary in accordance with the potential applied to the gate electrode 103 of the gate portion 100G. In this case, since a negative voltage is applied to the gate portion 100G, a negative voltage is applied to the two-dimensional hole gas layer in the semiconductor laminated body 50. As a result, the two-dimensional hole gas layer and the two-dimensional electron gas layer in the semiconductor laminated body 50 are depleted. When the two-dimensional hole gas layer and the two-dimensional electron gas layer are depleted, positive fixed charge and negative fixed charge of the barrier layer 52 remain, so that an electric field between these fixed charges is generated in the direction perpendicular to the direction that connects the drain portion 100D with the source portion 100S. Thus, the semiconductor device 10E has a heterojunction type superjunction structure, and the strength of the electric field between the drain portion 100D and the source portion 100S can be made uniform. In particular, the strength of the electric field in a drill region between the drain portion 100D and the gate portion 100G can be made uniform, so that the semiconductor device 10E can exhibit a high breakdown voltage characteristic.

Further, in the semiconductor device 10E, the p-type gate semiconductor region 104 of each gate portion 100G is insulated by the gate-side insulating region 230, from the two-dimensional electron gas layer in the semiconductor laminated body 50. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layer. In other words, even when a negative voltage required to favorably deplete the two-dimensional hole gas layer and two-dimensional electron gas layer in the semiconductor laminated body 50 is applied to the gate electrode 103 of the gate portion 100G, insulation leakage is less likely or unlikely to occur between the p-type gate semiconductor region 104 of the gate portion 100G and the two-dimensional electron gas layer. Therefore, the two-dimensional hole gas layer and the two-dimensional electron gas layer in the semiconductor laminated body 50 are favorably depleted, and the semiconductor device 10E can exhibit a high breakdown voltage characteristic.

Further, in the semiconductor device 10E, the n-type drain semiconductor region 102 of the drain portion 100D is insulated by the drain-side insulating region 228, from the two-dimensional hole gas layer in the semiconductor laminated body 50, and the n-type source semiconductor region 106 of the source portion 100S is insulated by the source-side insulating region 232 from the two-dimensional hole gas layer in the semiconductor laminated body 50. Therefore, insulation leakage is less likely or unlikely to occur between the n-type drain semiconductor region 102 of the drain portion 100D and the two-dimensional hole gas layer, and between the n-type source semiconductor region 106 of the source portion 100S and the two-dimensional hole gas layer, and the semiconductor device 10E can exhibit a high breakdown voltage characteristic.

Also, in the semiconductor device 10E, the thickness of the n-channel layer 51 and the thickness of the p-channel layer 53 are adjusted to be smaller than the distance between the two-dimensional electron gas layer and the two-dimensional hole gas layer. With this arrangement, the whole of the semiconductor laminated body 50, namely, the pair of two-dimensional carrier gas layers and carriers between these layers are favorably depleted, and the semiconductor device 10E can exhibit a high breakdown voltage characteristic.

Sixth Example

Figure 11:
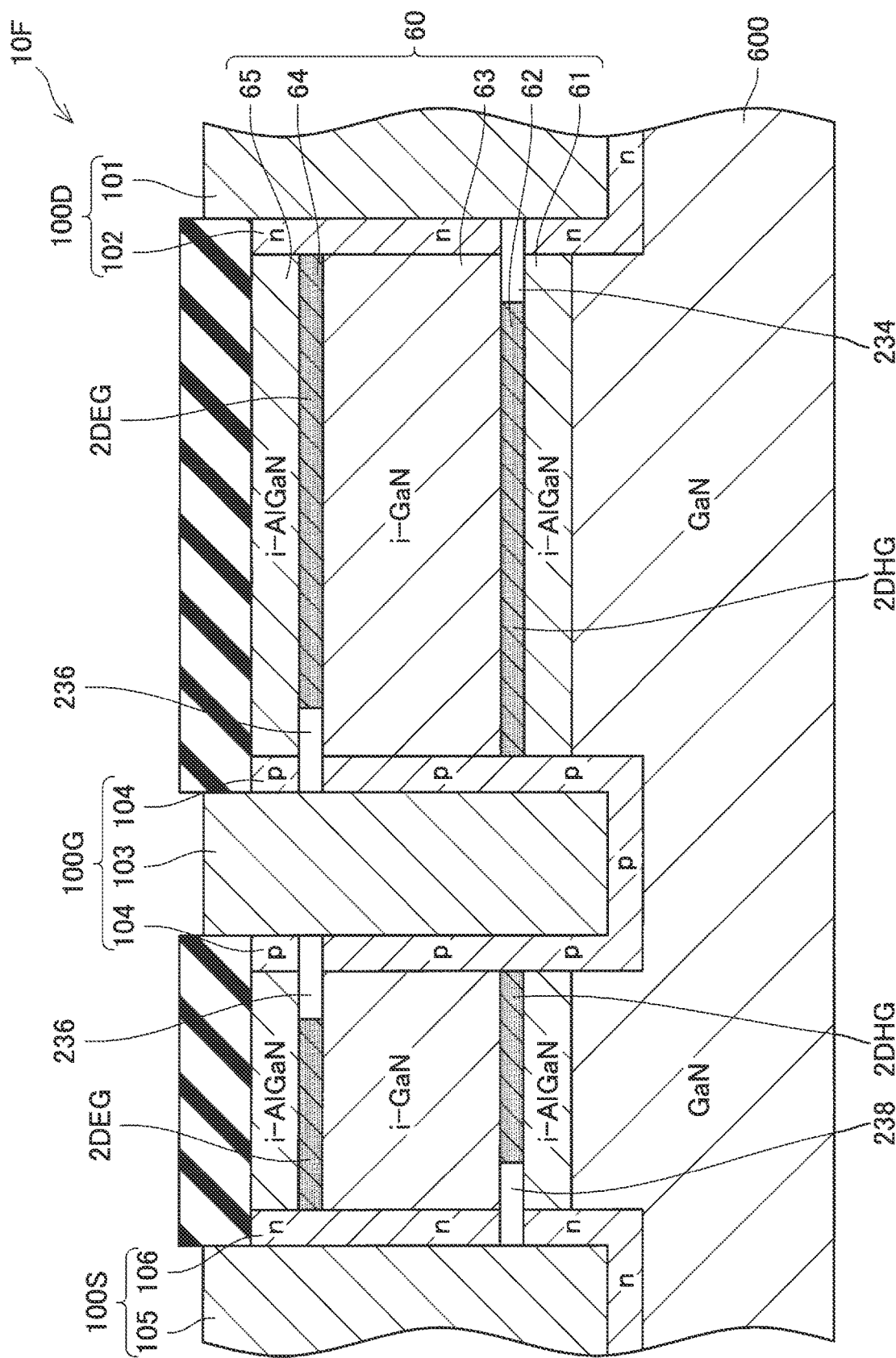
FIG. 11 is a cross-sectional view schematically showing a principal part of a semiconductor device of a sixth example.

FIG. 11 shows a semiconductor device 10F of a sixth embodiment. The semiconductor device 10F includes a substrate 600, semiconductor laminated body 60, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 60, like the gate portions 1G of FIG. 3 and FIG. 4.

The substrate 600 is a semi-insulating GaN substrate. The substrate 600 may include a buffer layer of a nitride semiconductor, for improvement of the crystalline nature of the semiconductor laminated body 60. Also, a semi-insulating Si substrate or a sapphire substrate may be used as the substrate 600, in place of the semi-insulating GaN substrate.

The semiconductor laminated body 60 is located between the drain portion 100D and the source portion 100S, and has a first barrier layer 61 of i-AlGaN, p-channel quantum well layer 62 of i-InGaN, channel layer 63 of i-GaN, n-channel quantum well layer 64 of i-InGaN, and second barrier layer 65 of i-AlGaN. The first barrier layer 61, p-channel quantum well layer 62, channel layer 63, n-channel quantum well layer 64, and second barrier layer 65 are grown and formed in this order from a surface of the substrate 600, by the metal organic chemical vapor deposition method.

The semiconductor device 10F further includes a drain-side insulating region 234, gate-side insulating regions 236, and source-side insulating region 238. These insulating regions 234, 236, 238 are in the form of voids.

The drain-side insulating region 234 is formed by etching a part of the u-channel quantum well layer 62 and a part of the n-type drain semiconductor region 102, and is formed between the p-channel quantum well layer 62 and the drain electrode 101 of the drain portion 100D. With the drain-side insulating region 234 thus provided, p-n junction is not formed between a two-dimensional hole gas layer (2DHG) in the p-channel quantum well layer 62 and the n-type drain semiconductor region 102. The drain-side insulating region 234 may be replaced with another alternative means, provided that the two-dimensional hole gas layer and the n-type drain semiconductor region 102 do not directly contact with each other. For example, an insulator, or an insulating or semi-insulating high-resistance semiconductor may be formed, in place of the void, in a region corresponding to the drain-side insulating region 234. Alternatively, when the p-channel quantum well layer 62 and the n-type drain semiconductor region 102 are formed in the region corresponding to the drain-side insulating region 234, a void, or an insulator, or insulating or semi-insulating high-resistance semiconductor of a material that does not give rise to a two-dimensional hole gas layer may be formed in the first barrier layer 61 adjacent to the region corresponding to the drain-side insulating region 234.

Each of the gate-side insulating regions 236 is formed by etching a part of the n-channel quantum well layer 64 and a part of the p-type gate semiconductor region 104, and is formed between the n-channel quantum well layer 64 and the gate electrode 103 of the gate portion 100G. With the gate-side insulating region 236 thus provided, p-n junction is not formed between a two-dimensional electron gas layer (2DEG) in the n-channel quantum well layer 64 and the p-type gate semiconductor region 104. The gate-side insulating region 236 may be replaced with another alternative means, provided that the two-dimensional electron gas layer and the p-type gate semiconductor region 104 do not directly contact with each other. For example, an insulator, or an insulating or semi-insulating high-resistance semiconductor may be formed, in place of the void, in a region corresponding to the gate-side insulating region 236. Alternatively, when the n-channel quantum well layer 64 and the p-type gate semiconductor region 104 are formed in the region corresponding to the gate-side insulating region 236, an insulator, or insulating or semi-insulating high-resistance semiconductor of a material that does not give rise to a two-dimensional electron gas layer may be formed in the second barrier layer 65 adjacent to the region corresponding to the gate-side insulating region 236.

The source-side insulating region 238 is formed by etching a an of the p-channel quantum well layer 62 and a part of the n-type source semiconductor region 106, and is formed between the p-channel quantum well layer 62 and the source electrode 105 of the source portion 100S. With the source-side insulating region 238 thus provided, p-n junction is not formed between the two-dimensional hole gas layer in the p-channel quantum well layer 62 and the n-type source semiconductor region 106. The source-side insulating region 238 may be replaced with another alternative means, provided that the two-dimensional hole gas layer and the n-type source semiconductor region 106 do not directly contact with each other. For example, an insulator, or an insulating or semi-insulating high-resistance semiconductor may be formed in place of the void, in a region corresponding to the source-side insulating region 238. Alternatively, when the p-channel quantum well layer 62 and the n-type source semiconductor region 106 are formed in the region corresponding to the source-side insulating region 238, a void, or an insulator, or insulating or semi-insulating high-resistance semiconductor of a material that does not give rise to a two-dimensional hole gas layer may be formed in the first barrier layer 61 adjacent to the region corresponding to source-side insulating region 238.

Next, operation of the semiconductor device 10F will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10F is placed in the ON state. At this time, the first barrier layer 61 is polarized such that negative fixed charge is induced on its interface closer to the p-channel quantum well layer 62, through spontaneous polarization and piezoelectric polarization, With the first barrier layer 61 thus polarized, a two-dimensional hole gas layer is produced in the p-channel quantum well layer 62 formed in the heterojunction interface between the first barrier layer 61 and the channel layer 63. On the other hand, the second barrier layer 65 is polarized such that positive fixed charge is induced on its interface closer to the n-channel quantum well layer 64, through spontaneous polarization and piezoelectric polarization. With the second barrier layer 65 thus polarized, a two-dimensional electron gas layer is produced in the n-channel quantum well layer 64 formed in the heterojunction interface between the channel layer 63 and the second barrier layer 65. In the semiconductor device 10F, the drain portion 100D and the source portion 100S are electrically connected with each other via the two-dimensional electron gas layer in the semiconductor laminated body 60. Thus, the semiconductor device 10F can provide low ON-resistance, since current flows through the two-dimensional electron gas layer.

When a positive voltage is applied to the drain electrode 101 of the drain portion 100D, and the source electrode 105 of the source portion 100S is grounded, while a negative voltage is applied to the gate electrode 103 of each gate portion 100G the semiconductor device 10F is placed in the OFF state. The p-type gate semiconductor region 104 of each gate portion 100G is in ohmic contact with the two-dimensional hole gas layer in the semiconductor laminated body 60. Therefore, the potential of the two-dimensional hole gas layer in the semiconductor laminated body 60 can vary in accordance with the potential applied to the gate electrode 103 of the gate portion 100G. In this case, since a negative voltage is applied to the gate portion 100G, a negative voltage is applied to the two-dimensional hole gas layer in the semiconductor laminated body 60. As a result, the two-dimensional hole gas layer and the two-dimensional electron gas layer in the semiconductor laminated body 60 are depleted. When the two-dimensional hole gas layer and the two-dimensional electron gas layer are depleted, positive fixed charge of the second barrier layer 65 and negative fixed charge of the first barrier layer 61 remain, so that an electric field between these fixed charges is generated in the direction perpendicular to the direction that connects the drain portion 100D with the source portion 100S. Thus, the semiconductor device 101F has a heterojunction type super-junction structure, and the strength of the electric field between the drain portion 100D and the source portion 100S can be made uniform. In particular, the strength of the electric field in a drift region between the drain portion 100D and the gate portion 100G can be made uniform, so that the semiconductor device 10F can exhibit a high breakdown voltage characteristic.

Further, in the semiconductor device 10F, the p-type gate semiconductor region 104 of each gate portion 100G is insulated by the gate-side insulating region 236, from the two-dimensional electron gas layer in the semiconductor laminated body 60. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layer. In other words, even when a negative voltage required to favorably deplete the two-dimensional hole gas layer and two-dimensional electron gas layer in the semiconductor laminated body 60 is applied to the gate electrode 103 of the gate portion 100G, insulation leakage is less likely or unlikely to occur between the p-type gate semiconductor region 104 of the gate portion 100G and the two-dimensional electron gas layer. Therefore, the two-dimensional hole gas layer and the two-dimensional electron gas layer in the semiconductor laminated body 60 are favorably depleted, and the semiconductor device 10F can exhibit a high breakdown voltage characteristic.

Further, in the semiconductor device 10F, the n-type drain semiconductor region 102 of the drain portion 100D is insulated by the drain-side insulating region 234, from the two-dimensional hole gas layer in the semiconductor laminated body 60, and the n-type source semiconductor region 106 of the source portion 100S is insulated by the source-side insulating region 238 from the two-dimensional hole gas layer in the semiconductor laminated body 60. Therefore, insulation leakage is less likely or unlikely to occur between the n-type drain semiconductor region 102 of the drain portion 100D and the two-dimensional hole gas layer, and between the n-type source semiconductor region 106 of the source portion 100S and the two-dimensional hole gas layer, and the semiconductor device 10F can exhibit a high breakdown voltage characteristic.

Also, in the semiconductor device 10F, the thickness of the first barrier layer 61 and the thickness of the second barrier layer 65 are adjusted to be smaller than the distance between the two-dimensional electron gas layer and the two-dimensional hole gas layer. With this arrangement, the whole of the semiconductor laminated body 60, namely, the pair of two-dimensional carrier gas layers and carriers between these layers are favorably depleted, and the semiconductor device 10F can exhibit a high breakdown voltage characteristic.

Also, the semiconductor device 10F is configured such that both of the two-dimensional electron gas layer and the two-dimensional hole gas layer are located in the quantum wells. Therefore, carriers are less likely or unlikely to leak from the quantum wells, and the semiconductor device 10F can exhibit a low leakage current characteristic.

Seventh Example

Figure 12:
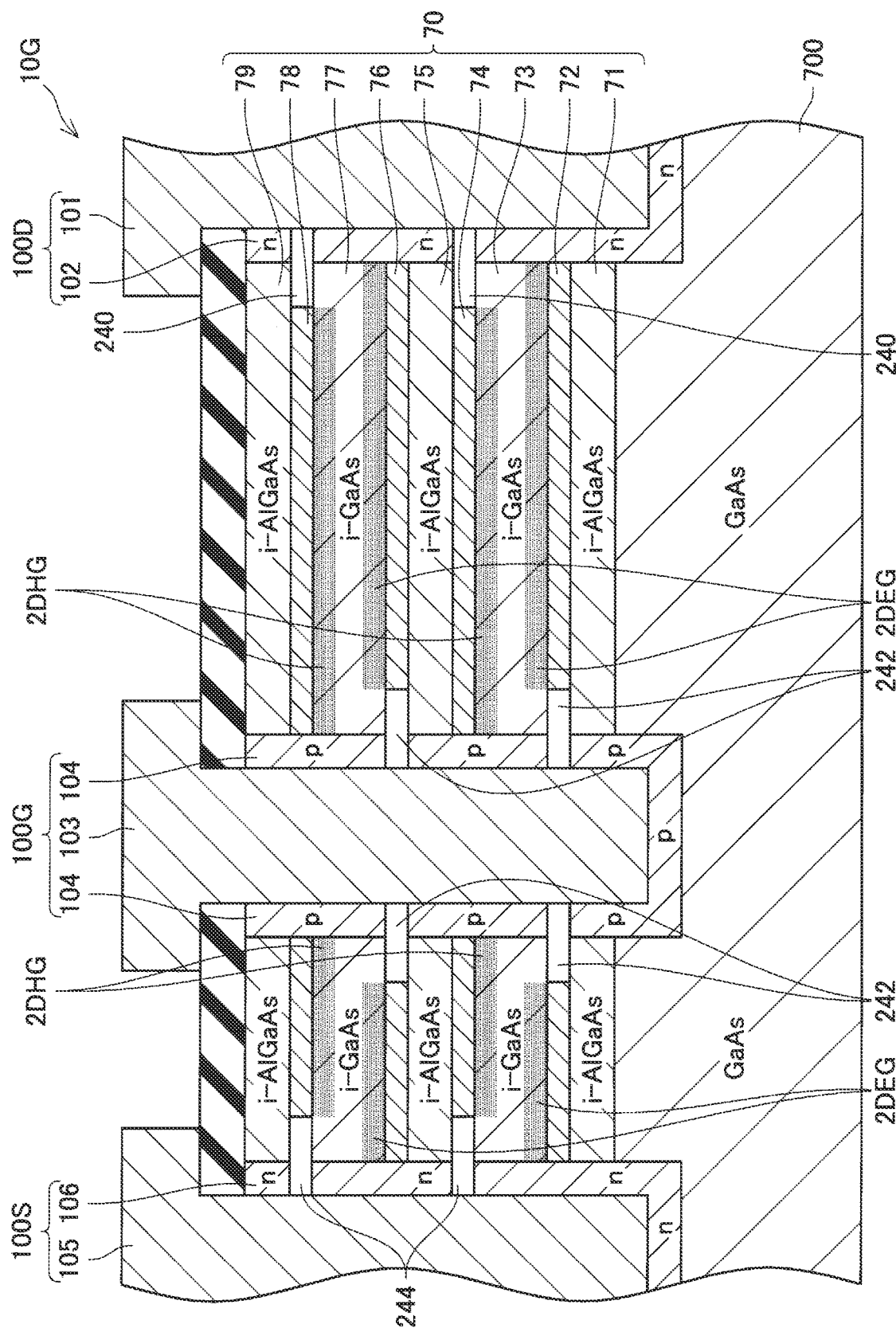
FIG. 12 is a cross-sectional view schematically showing a principal part of a semiconductor device of a seventh example.

FIG. 12 shows a semiconductor device 10G of a seventh embodiment. The semiconductor device 10G includes a substrate 700, semiconductor laminated body 70, drain portion 100D, source portion 100S, and a plurality of gate portions 100G. Although not illustrated in the drawings, the gate portions 100G are arranged to be spaced from each other in a direction perpendicular to the direction that connects the drain portion 100D with the source region 100S and the lamination direction of the semiconductor laminated body 70, like the gate portions 1G of FIG. 3 and FIG. 4.

The substrate 700 is a semi-insulating GaAs substrate. The substrate 700 may include a buffer layer of a GaAs-based semiconductor, for improvement of the crystalline nature of the semiconductor laminated body 70.

The semiconductor laminated body 70 is located between the drain portion 100D and the source portion 10S, and has a first barrier layer 71 of i-AlGaAs, electron supply layer 72 of n-InGaP channel layer 73 of i-GaAs hole supply layer 74 of p-InGaP, second barrier layer 75 of i-AlGaAs, electron supply layer 76 of n-InGaP, channel layer 77 of i-GaAs, hole supply layer 78 of p-InGaP, and third barrier layer 79 of i-AlGaAs. The first barrier layer 71, electron supply layer 72, channel layer 73, hole supply layer 74, second barrier layer 75, electron supply layer 76, channel layer 77, hole supply layer 78, and third barrier layer 79 are grown and formed in this order from a surface of the substrate 700, by the metal organic chemical vapor deposition method.

The semiconductor device 10G further includes a plurality of drain-side insulating regions 240, a plurality of gate-side insulating regions 242, and a plurality of source-side insulation regions 244. These insulating regions 240, 242, 244 are in the form of voids.

The drain-side insulating regions 240 are formed by etching parts of the hole supply layers 74, 78 and parts of the n-type drain semiconductor regions 102, and are formed between the hole supply layers 74, 78 and the drain electrode 101 of the drain portion 100D. With the drain-side insulating regions 240 thus provided, no two-dimensional hole gas layers (2DHG) are produced in the channel layers 73, 77 adjacent to the drain-side insulating regions 240, and p-n junctions are not formed between the two-dimensional hole gas layers and the n-type drain semiconductor region 102. Each of the drain-side insulating regions 240 may be replaced with another alternative means, provided that the two-dimensional hole gas layer and the n-type drain semiconductor region 102 do not directly contact with each other. For example, an insulator, or an insulating or semi-insulating high-resistance semiconductor of a material that does not give rise to a two-dimensional hole gas layer may be formed in a region corresponding to the drain-side insulating region 240. Alternatively, a void, insulator, or insulating or semi-insulating high-resistance semiconductor may be formed at a position between the two-dimensional hole gas layer and the n-type drain semiconductor region 102.

The gate-side insulating regions 242 are formed by etching parts of the electron supply layers 72, 76 and parts of the p-type gate semiconductor region 104, and are formed between the electron supply layers 72, 76 and the gate electrode 103 of each gate portion 100G. With the gate-side insulating regions 242 thus provided, no two-dimensional electron gas layers (2DEG) are produced in the channel layers 73, 77 adjacent to the gate-side insulating regions 242, and p-n junctions are not formed between the two-dimensional electron gas layers and the p-type gate semiconductor region 104. Each of the gate-side insulating regions 242 may be replaced with another alternative means, provided that the two-dimensional electron gas layer and the p-type gate semiconductor region 104 do not directly contact with each other. For example, an insulator, or an insulating or semi-insulating high-resistance semiconductor of a material that does not give rise to a two-dimensional electron gas layer may be formed in a region corresponding to the gate-side insulating region 242. Alternatively, a void, insulator, or insulating or semi-insulating high-resistance semiconductor may be formed at a position between the two-dimensional electron gas layer and the p-type gate semiconductor region 104.

The source-side insulating regions 244 are formed by etching parts of the hole supply layer 74, 78 and parts of the n-type source semiconductor region 106, and are formed between the hole supply layers 74, 78 and the source electrode 105 of the source portion 100S. With the source-side insulating regions 244 thus provided, no two-dimensional hole gas layers are produced in the channel layers 73, 77 adjacent to the source-side insulating regions 244, and p-n junctions are not formed between the two-dimensional hole gas layers and the n-type source semiconductor region 106. Each of the source-side insulating regions 244 may be replaced with another alternative means, provided that the two-dimensional hole gas layer and the n-type source semiconductor region 106 do not directly contact with each other. For example, an insulator, or an insulating or semi-insulating high-resistance semiconductor of a material that does not give rise to a two-dimensional hole gas layer may be formed in a region corresponding to the source-side insulating region 244. Alternatively, a void, insulator, or insulating or semi-insulating high-resistance semiconductor may be formed at a position between the two-dimensional hole gas layer and the n-type source semiconductor region 106.

Next, operation of the semiconductor device 10G will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10G is placed in the ON state. At this time, electrons are supplied from the electron supply layer 72 to the channel layer 73 side of the heterojunction interface between the electron supply layer 72 and the channel layer 73, to form a two-dimensional electron gas layer. Holes are supplied from the hole supply layer 74 to the channel layer 73 side of the heterojunction interface between the channel layer 73 and the hole supply layer 74, to form a two-dimensional hole gas layer. Electrons are supplied from the electron supply layer 76, to the channel layer 77 side of the heterojunction interface between the electron supply layer 76 and the channel layer 77, to form a two-dimensional electron gas layer. Holes are supplied from the hole supply layer 78, to the channel layer 77 side of the heterojunction interface between the channel layer 77 and the hole supply layer 78, to form a two-dimensional hole gas layer. In the semiconductor device 10G, the drain portion 100D and the source portion 100S are electrically connected with each other via the two-dimensional electron gas layers in the semiconductor laminated body 70. Thus, the semiconductor device 10G can provide low ON-resistance, since current flows through the two-dimensional electron gas layers.

When a positive voltage is applied to the drain electrode 101 of the drain portion 100D, and the source electrode 105 of the source portion 100S is grounded, while a negative voltage is applied to the gate electrode 103 of each gate portion 100G, the semiconductor device 10G is placed in the OFF state. The p-type gate semiconductor region 104 of each of the gate portions 100G is in ohmic contact with the two-dimensional hole gas layers in the semiconductor laminated body 70. Therefore, the potential of the two-dimensional hole gas layers in the semiconductor laminated body 70 can vary in accordance with the potential applied to the gate electrode 103 of the gate portion 100G. In this case, since a negative voltage is applied to the gate portion 100G, a negative voltage is applied to the two-dimensional hole gas layers in the semiconductor laminated body 70. As a result, the two-dimensional hole gas layers and the two-dimensional electron gas layers in the semiconductor laminated body 70 are depleted. When the two-dimensional hole gas layers and the two-dimensional electron gas layers are depleted, positive fixed charge remains in regions where the two-dimensional electron gas layers are depleted, and negative fixed charge remains in regions where the two-dimensional hole gas layers are depleted, so that electric fields between these fixed charges are generated in a direction perpendicular to the direction that connects the drain portion 100D with the source portion 100S. Thus, the semiconductor device 10G has a heterojunction type super junction structure, and the strength of the electric field between the drain portion 100D and the source portion 100S can be made uniform. In particular, the strength of the electric field in a drift region between the drain portion 100D and the gate portion 100G can be made uniform, so that the semiconductor device 10G can exhibit a high breakdown voltage characteristic.

Further, in the semiconductor device 10G, the p-type gate semiconductor region 104 of each gate portion 100G is insulated by the gate-side insulating regions 242, from the two-dimensional electron gas layers in the semiconductor laminated body 70. Therefore, it is possible to apply a sufficiently low voltage to the gate electrode 103 of the gate portion 100G, while curbing insulation leakage between the p-type gate semiconductor region 104 of the gate portion 100G and the two-dimensional electron gas layers. In other words, even when a negative voltage required to favorably deplete the two-dimensional hole gas layers and two-dimensional electron gas layers in the semiconductor laminated body 70 is applied to the gate electrode 103 of the gate portion 100G, insulation leakage is less, likely or unlikely to occur between the p-type gate semiconductor region 104 of the gate portion 100G and the two-dimensional electron gas layers. Therefore, the two-dimensional hole gas layers and two-dimensional electron gas layers in the semiconductor laminated body 70 are favorably depleted, and the semiconductor device 100 can exhibit a high breakdown voltage characteristic.

Further, in the semiconductor device 10G, the n-type drain semiconductor region 102 of the drain portion 100D is insulated by the drain-side insulating regions 240 from the two-dimensional hole gas layers in the semiconductor laminated body 70, and the n-type source semiconductor region 106 of the source portion 100S is insulated by the source-side insulating region 244 from the two-dimensional hole gas layers in the semiconductor laminated body 70. Therefore, insulation leakage is less likely or unlikely to occur between the n-type drain semiconductor region 102 of the drain portion 100D and the two-dimensional hole gas layers, and between the n-type source semiconductor region 106 of the source portion 100S and the two-dimensional hole gas layers, and the semiconductor device 10G can exhibit a high breakdown voltage characteristic.

Also, in the semiconductor device 10 the thickness of the first barrier layer 71 and the thickness of the third barrier layer 79 are adjusted to be smaller than the distance between the two-dimensional electron gas layer and the two-dimensional hole gas layer. With this arrangement, the whole of the semiconductor laminated body 70, namely, the pair of two-dimensional carrier gas layers and carriers between these layers are favorably depleted, and the semiconductor device 100 can exhibit a high breakdown voltage characteristic.

Eighth Embodiment

Figure 13:
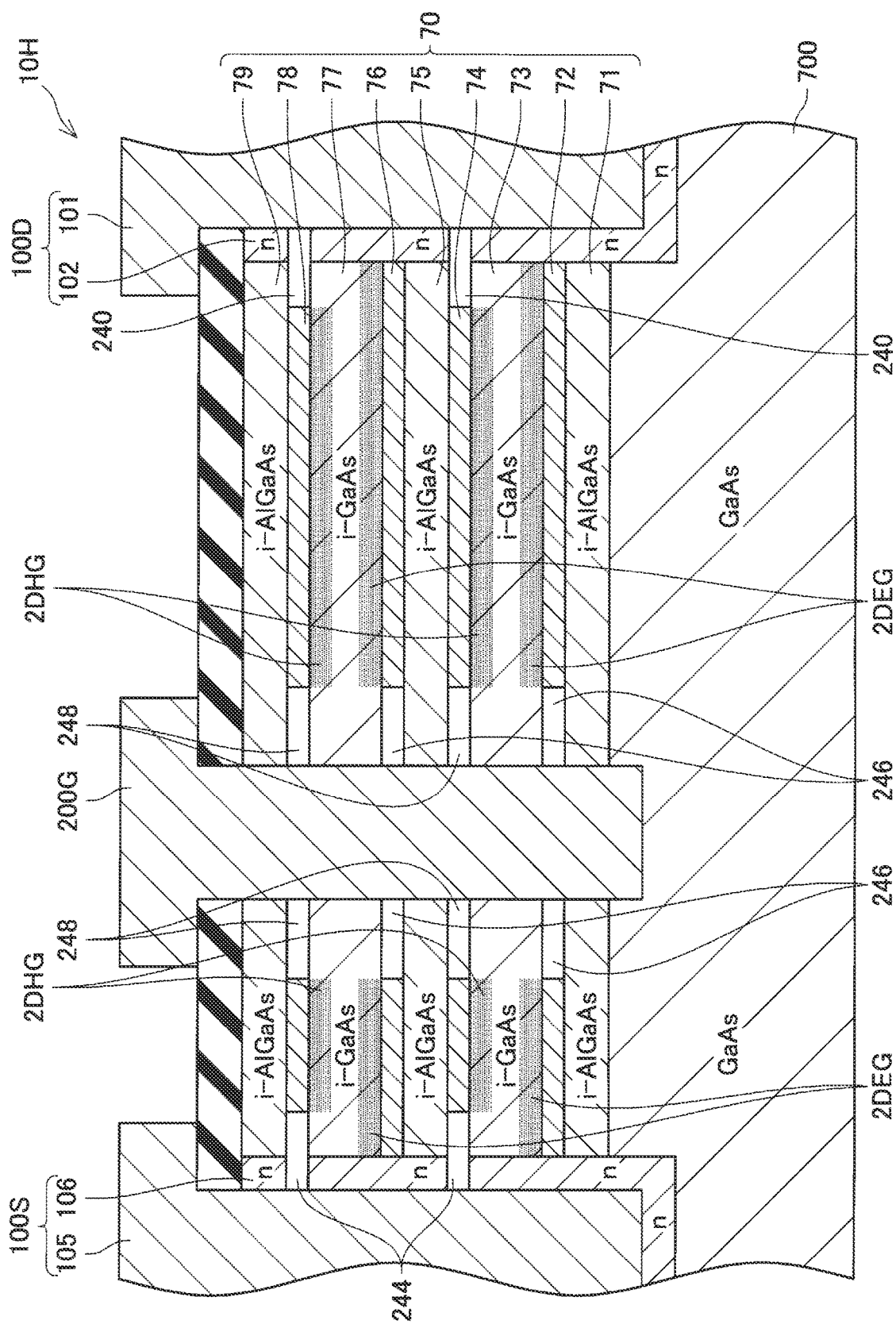
FIG. 13 is a cross-sectional view schematically showing a principal part of a semiconductor device of an eighth example.

FIG. 13 slows a semiconductor device 1014 of an eighth embodiment. The semiconductor device 10H is a modified example of the semiconductor device 10G of the seventh embodiment shown in FIG. 12. The semiconductor device 10H is not provided with the p-type gate semiconductor regions 104 like those of the semiconductor device 100 of the seventh embodiment, but is characterized in that each of the gate portions 200G consists solely of a Schottky electrode. The Schottky electrode of the gate portion 200G is formed of a material that can be joined via Schottky junction to GaAs-based semiconductors of the semiconductor laminated body 70. The semiconductor device 10H is further characterized by including a plurality of gate-side insulating regions 246 provided for two-dimensional electron gas layers (2DEG), and a plurality of gate-side insulating regions 248 provided for two-dimensional hole gas layers (2DHG). Each of the gate-side insulating regions 246, 248 is in the form of a void.

The gate-side insulating regions 246 provided for the two-dimensional electron gas layers are formed by etching respective parts of the electron supply layers 72, 76, and are formed between the electron supply layers 72, 76 and the Schottky electrode 200G. With the gate-side insulating regions 246 thus provided, no two-dimensional electron gas layers are produced in the channel layers 73, 77 adjacent to the gate-side insulating regions 246, and Schottky junctions are not formed between the two-dimensional electron, gas layers and the Schottky electrode 200G. The gate-side insulating regions 246 may be replaced with another alternative means, provided that the two-dimensional electron gas layers and the Schottky electrode 200G do not directly contact with each other. For example, an insulator, or an insulating or semi-insulating high-resistance semiconductor of a material that does not give rise to a two-dimensional electron gas layer may be formed in a region corresponding to each of the gate-side insulating regions 246. Alternatively, a void, insulator, or insulating or semi-insulating high-resistance semiconductor may be formed at a position between each of the two-dimensional electron gas layers and the Schottky electrode 200G.

The gate-side insulating regions 248 provided for the two-dimensional hole gas layers are formed by etching respective parts of the hole supply layers 74, 78, and are formed between the hole supply layers 74, 78 and the Schottky electrode 200G. With the gate-side insulating regions 248 thus provided, no two-dimensional, hole gas layers are produced in the channel layers 73, 77 adjacent to the gate-side insulating regions 248, and Schottky junctions are not formed between the two-dimensional electron gas layers and the Schottky electrode 200G. The gate-side insulating regions 248 may be replaced with another alternative means, provided that the two-dimensional hole gas layers and the Schottky electrode 200G do not directly contact with each other. For example, an insulator, or an insulating or semi-insulating high-resistance semiconductor of a material that does not give rise to a two-dimensional hole gas layer may be formed in a region corresponding to each of the gate-side insulating regions 248. Alternatively, a void, insulator, or insulating or semi-insulating high-resistance semiconductor may be formed at a position between each of the two-dimensional hole gas layers and the Schottky electrode 200G.

Thus, in the semiconductor device 10H, the two-dimensional hole gas layers are insulated from all of the drain portion 100D, gate portions 100G, and source portion 100S, and the potential of the two-dimensional hole gas layers is in a floating state.

Next, operation of the semiconductor device 10H will be described. When a positive voltage is applied to the drain electrode 101 of the drain portion 100D, and the source electrode 105 of the source portion 100S is grounded, while the gate electrodes 103 of the gate portions 100G are grounded, the semiconductor device 10H is placed in the ON state. At this time, electrons are supplied from the electron supply layer 72, to the channel layer 73 side of the heterojunction interface between the electron supply layer 72 and the channel layer 73, to form a two-dimensional electron gas layer. Holes are supplied from the hole supply layer 74, to the channel layer 73 side of the heterojunction interface between the channel layer 73 and the hole supply layer 74, to form a two-dimensional hole gas layer. Electrons are supplied from the electron supply layer 76, to the channel layer 77 side of the heterojunction interface between the electron supply layer 76 and the channel layer 77, to form a two-dimensional electron gas layer. Holes are supplied from the hole supply layer 78, to the channel layer 77 side of the heterojunction interface between the channel layer 77 and the hole supply layer 78, to from a two-dimensional hole gas layer. In the semiconductor device 10H, the drain portion 100D and the source portion 100S are electrically connected with each other via the two-dimensional electron gas layers in the semiconductor laminated body 70. Thus, the semiconductor device 10H can provide low ON-resistance, since current flows through the two-dimensional electron gas layers (2DEG).

When a positive voltage is applied to the drain electrode 101 of the drain portion 100D, and the source electrode 105 of the source portion 100S is grounded, while a negative voltage is applied to the gate electrode 103 of each gate portion 100G, the semiconductor device 10H is placed in the OFF state. As described above, the potential of the two-dimensional hole gas layers in the semiconductor laminated body 70 is in the floating state. The potential of the two-dimensional hole gas layers in the semiconductor laminated body 70 can vary in accordance with the potential applied to the Schottky electrode 200G via capacitance coupling. In this case, since a negative voltage is applied to the Schottky electrode 200G, a negative voltage is applied to the two-dimensional hole gas layers in the semiconductor laminated body 70. As a result, the two-dimensional hole gas layers and the two-dimensional electron gas layers in the semiconductor laminated body 70 are depleted. When the two-dimensional hole gas layers and the two-dimensional electron gas layers are depleted, positive fixed charge remains in regions where the two-dimensional electron gas layers are depleted, and negative fixed charge remains in regions where the two-dimensional hole gas layers are depleted, so that electric fields between these fixed charges are generated in a direction perpendicular to the direction that connects the drain portion 100D with the source portion 100. Thus, the semiconductor device 10H has a heterojunction type super-junction structure, and the strength of the electric field between the drain portion 100D and the source portion 100S can be made uniform. In particular, the strength of the electric field in a drift region between the drain portion 100D and the gate portion 100G can be made uniform, so that the semiconductor device 10H can exhibit a high breakdown voltage characteristic.

While some specific examples of the disclosure have been described in detail, these are merely exemplary ones, and are not intended to limit the appended claims. For example, the order of the two-dimensional electron gas layer and two-dimensional hole gas layer produced in the semiconductor laminated body as viewed in the vertical direction (lamination direction) is not limited to those of the above examples. Namely, the Iwo-dimensional electron gas layer and the two-dimensional hole gas layer may be arranged in this order from the top surface side, or the two-dimensional hole gas layer and the two-dimensional electron gas layer may be arranged in this order from the top surface side.

The specific examples illustrated above may be modified or changed in various fashions, and the modified examples are also included in the technologies described in the claims. Also, technical elements described in this specification or drawings exhibit technical utilities when they are used alone or in various combinations, and are not limited to combinations described in the claims as filed. Also, the technologies illustrated in the specification or drawings may achieve two or more objects at the same time, but have technical utilities only by achieving one of the objects.

What is claimed is:

1. A semiconductor device, comprising:
a drain portion;
a source portion;
a semiconductor laminated body provided between the drain portion and the source portion, the semiconductor laminated body including a plurality of semiconductor layers laminated together, and having at least a first heterojunction a second heterojunction, a third heterojunction, and a fourth heterojunction, the semiconductor laminated body having a first two-dimensional electron gas layer adjacent to an interface of the first heterojunction, a second two-dimensional electron gas layer adjacent to an interface of the third heterojunction, a first two-dimensional hole gas layer adjacent to an interface of the second heterojunction, and a second two-dimensional hole gas layer adjacent to an interface of the fourth heterojunction; and
at least one gate portion located between the drain portion and the source portion, the at least one gate portion extending through the first heterojunction and the second heterojunction of the semiconductor laminated body,
wherein the drain portion and the source portion are electrically connected to one of the first two-dimensional electron gas layer and the first two-dimensional hole gas layer, and the at least one gate portion is configured to be prevented by an insulating region from directly contacting the one of the first two-dimensional electron gas layer and the first two-dimensional hole gas layer.

2. The semiconductor device according to claim 1, wherein the at least one gate portion is configured to be able to adjust a potential of the other of the first two-dimensional electron gas layer and the first two-dimensional hole gas layer, based on a gate voltage applied to the at least one gate portion.

3. The semiconductor device according to claim 2, wherein the one of the first two-dimensional electron gas layer and the first two-dimensional hole gas layer and the at least one gate portion are kept insulated from each other, until the first two-dimensional electron gas layer and the first two-dimensional hole gas layer are depleted due to the potential of the other of the first two-dimensional electron gas layer and the first two-dimensional hole gas layer.

4. The semiconductor device according to claim 2, wherein:
the drain portion has an n-type drain semiconductor region, and the source portion has an n-type source semiconductor region, while each of the at least one gate portion has a p-type gate semiconductor region; and
the n-type drain semiconductor region of the drain portion and the n-type source semiconductor region of the source portion are electrically connected to the first two-dimensional electron gas layer, and the p-type gate semiconductor region of each of the at least one gate portion is electrically connected to the first two-dimensional hole gas layer.

5. The semiconductor device according to claim 2, wherein the other of the first two-dimensional electron gas layer and the first two-dimensional hole gas layer is insulated from the drain portion, the source portion, and the at least one gate portion, and a potential of the other of the first two-dimensional electron gas layer and the first two-dimensional hole gas layer is in a floating state.

6. The semiconductor device according to claim 5, wherein each of the at least one gate portion extends through the first heterojunction and the second heterojunction of the semiconductor laminated body, and has a Schottky electrode including a material that permits Schottky junction between the Schottky electrode and the semiconductor laminated body.

7. The semiconductor device according to claim 6, wherein:
the drain portion has an n-type drain semiconductor region, and the source portion has an n-type source semiconductor region; and
the n-type drain semiconductor region of the drain portion and the n-type source semiconductor region of the source portion are electrically connected to the first two-dimensional electron gas layer, and the first two-dimensional hole gas layer is insulated from the n-type drain semiconductor region of the drain portion, the n-type source semiconductor region of the source portion, and the Schottky electrode of each of the at least one gate portion, such that a potential of the first two-dimensional hole gas layer is in a floating state.

8. The semiconductor device according to claim 1, wherein:
the plurality of semiconductor layers of the semiconductor laminated body includes a first semiconductor layer located closest to a top surface of the semiconductor laminated body, and a second semiconductor layer located closest to a rear surface of the semiconductor laminated body;
the first semiconductor layer has a thickness that is smaller than a distance between the first two-dimensional electron gas layer and the first two-dimensional hole gas layer located next to each other in the semiconductor laminated body; and
the second semiconductor layer has a thickness that is smaller than the distance between the first two-dimensional electron gas layer and the first two-dimensional hole gas layer located next to each other in the semiconductor laminated body.

9. The semiconductor device according to claim 8, wherein:
the thickness of the first semiconductor layer is adjusted such that the first semiconductor layer is depleted when the semiconductor device is placed in an OFF state; and
the thickness of the second semiconductor layer is adjusted such that the second semiconductor layer is depleted when the semiconductor device is placed in the OFF state.

10. The semiconductor device according to claim 8, wherein each pair of the first two-dimensional electron gas layer and the first two-dimensional hole gas layer and the second two-dimensional electron gas layer and the second two-dimensional hole gas layer located next to each other has the same carrier density.

11. The semiconductor device according to claim 8, further comprising a substrate, wherein:
the semiconductor laminated body is provided on one surface of the substrate; and
the first semiconductor layer has a surface defect density of $1 \times 10^{11}$ cm$^{-2}$ or greater, and an interface between the second semiconductor layer and the substrate has an interface defect density of $1 \times 10^{11}$ cm$^{-2}$ or greater.

12. The semiconductor device according to claim 1, wherein at least one of the first two-dimensional electron gas layer and the first two-dimensional hole gas layer is located in a quantum well or in a superlattice structure.

13. The semiconductor device according to claim 1, wherein:
the at least one gate portion comprises a plurality of gate portions; and
each of the gate portions extends through the first heterojunction and the second heterojunction of the semiconductor laminated body, and the gate portions are arranged to be separated from each other in a direction perpendicular to a direction that connects the drain portion with the source portion and a lamination direction of the semiconductor laminated body.

14. A semiconductor device, comprising:
a drain portion;
a source portion;
a semiconductor laminated body provided between the drain portion and the source portion, the semiconductor laminated body including a plurality of semiconductor layers laminated together, and having at least a first heterojunction and a second heterojunction, the semiconductor laminated body having a two-dimensional electron gas layer adjacent to an interface of the first heterojunction, and a two-dimensional hole gas layer adjacent to an interface of the second heterojunction; and
at least one gate portion located between the drain portion and the source portion, the at least one gate portion extending through the first heterojunction and the second heterojunction of the semiconductor laminated body, wherein:

the drain portion has a first-conductivity-type drain semiconductor region, and the source portion has a first-conductivity-type source semiconductor region, while each of the at least one gate portion has a second-conductivity-type gate semiconductor region; and the first-conductivity-type drain semiconductor region of the drain portion and the first-conductivity-type source semiconductor region of the source portion are electrically connected to one of the two-dimensional electron gas layer and the two-dimensional hole gas layer, and the second-conductivity-type gate semiconductor region of each of the at least one gate portion is configured to be prevented by an insulating region from contacting the one of the two-dimensional electron gas layer and the two-dimensional hole gas layer via p-n junction.

15. A semiconductor device, comprising:
a drain portion;
a source portion;
a semiconductor laminated body provided between the drain portion and the source portion, the semiconductor laminated body including a plurality of semiconductor layers laminated together, and having at least a first heterojunction and a second heterojunction, the semiconductor laminated body having a two-dimensional electron gas layer adjacent to an interface of the first heterojunction, and a two-dimensional hole gas layer adjacent to an interface of the second heterojunction; and at least one gate portion located between the drain portion and the source portion, the at least one gate portion extending through the first heterojunction and the second heterojunction of the semiconductor laminated body, wherein each of the at least one gate portion has a Schottky electrode including a material that permits Schottky junction between the Schottky electrode and the semiconductor laminated body; and the drain portion and the source portion are electrically connected to one of the two-dimensional electron gas layer and the two-dimensional hole gas layer, and the Schottky electrode of each of the at least one gate portion is configured to be prevented by an insulating region from contacting the one of the two-dimensional electron gas layer and the two-dimensional hole gas layer via the Schottky junction.

16. A semiconductor device, comprising:
a drain portion;
a source portion; and
a semiconductor laminated body provided between the drain portion and the source portion, the semiconductor laminated body including a plurality of semiconductor layers laminated together, and having at least a first heterojunction, a second heterojunction, a third heterojunction, and a fourth heterojunction, the semiconductor laminated body having a first two-dimensional electron gas layer adjacent to an interface of the first heterojunction, a second two-dimensional electron gas layer adjacent to an interface of the third heterojunction, a first two-dimensional hole gas layer adjacent to an interface of the second heterojunction, and a second two-dimensional hole gas layer adjacent to an interface of the fourth heterojunction, wherein:

the plurality of semiconductor layers of the semiconductor laminated body includes a first semiconductor layer located closest to a top surface of the semiconductor laminated body, and a second semiconductor layer located closest to a rear surface of the semiconductor laminated body;

the first semiconductor layer has a thickness that is smaller than a distance between the first two-dimensional electron gas layer and the first two-dimensional hole gas layer located next to each other in the semiconductor laminated body; and the second semiconductor layer has a thickness that is smaller than the distance between the first two-dimensional electron gas layer and the first two-dimensional hole gas layer located next to each other in the semiconductor laminated body.

17. The semiconductor device according to claim 16, wherein:
the thickness of the first semiconductor layer is adjusted such that the first semiconductor layer is depleted when the semiconductor device is placed in an OFF state; and
the thickness of the second semiconductor layer is adjusted such that the second semiconductor layer is depleted when the semiconductor device is placed in the OFF state.

18. The semiconductor device according to claim 16, wherein each pair of the first two-dimensional electron gas layer and the first two-dimensional hole gas layer and the second two-dimensional electron gas layer and the second two-dimensional hole gas layer located next to each other has the same carrier density.

19. The semiconductor device according to claim 16, further comprising a substrate, wherein:
the semiconductor laminated body is provided on one surface of the substrate; and
the first semiconductor layer has a surface defect density of $1\times10^{11}$ cm$^{-2}$ or greater, and an interface between the second semiconductor layer and the substrate has an interface defect density of $1\times10^{11}$ cm$^{-2}$ or greater.

20. A semiconductor device, comprising:
a drain portion;
a source portion;
a semiconductor laminated body provided between the drain portion and the source portion, the semiconductor laminated body including a plurality of semiconductor layers laminated together, and having at least a first heterojunction and a second heterojunction, the semiconductor laminated body having a two-dimensional electron gas layer adjacent to an interface of the first heterojunction, and a two-dimensional hole gas layer adjacent to an interface of the second heterojunction; and at least one gate portion located between the drain portion and the source portion, the at least one gate portion extending through the first heterojunction and the second heterojunction of the semiconductor laminated body, wherein the drain portion and the source portion are electrically connected to one of the two-dimensional electron gas layer and the two-dimensional hole gas layer, and the at least one gate portion is configured to be prevented by an insulating region from directly contacting the one of the two-dimensional electron gas layer and the two-dimensional hole gas layer, and wherein each of the at least one gate portion has a p-type gate semiconductor region, and the p-type gate semiconductor region of each of the at least one gate portion is electrically connected to the two-dimensional hole gas layer.

* * * * *

UNITED STATES PATENT AND TRADEMARK OFFICE
CERTIFICATE OF CORRECTION

PATENT NO. : 10,680,091 B2
APPLICATION NO. : 16/229613
DATED : June 9, 2020
INVENTOR(S) : Tomoyoshi Kushida et al.

It is certified that error appears in the above-identified patent and that said Letters Patent is hereby corrected as shown below:

On the Title Page

Item (72), inventor 1, city, delete "Nisshin" and insert --Nisshin-shi Aichi-ken--, therefor.
Item (72), inventor 2, city, delete "Toyota" and insert --Toyota-shi Aichi-ken--, therefor.
Item (72), inventor 3, city, delete "Nagoya" and insert --Nagoya-shi Aichi-ken--, therefor.
Item (72), inventor 4, city, delete "Nagoya" and insert --Nagoya-shi Aichi-ken--, therefor.

In the Specification

In Column 3, Line(s) 44, after "contacting", delete ",".
In Column 4, Line(s) 51, after "line", insert --I-I--.
In Column 5, Line(s) 29, after "portion", delete ",".
In Column 5, Line(s) 57, after "polarization", delete ",".
In Column 6, Line(s) 28, delete "dram" and insert --drain--, therefor.
In Column 6, Line(s) 67, after "1G", insert --.--.
In Column 7, Line(s) 6, after "region", delete ",".
In Column 7, Line(s) 12, delete "ease," and insert --case,--, therefor.
In Column 7, Line(s) 53, after "between", delete ",".
In Column 8, Line(s) 39, delete "1C" and insert --1G--, therefor.
In Column 8, Line(s) 42, delete "1C" and insert --1G--, therefor.
In Column 9, Line(s) 53, after "listed", delete "," and insert --.--, therefor.
In Column 10, Line(s) 25, after "layer", insert --1--.
In Column 12, Line(s) 18, after "distance", delete ",".
In Column 13, Line(s) 32, after "form", delete "of" and insert --of,--, therefor.
In Column 13, Line(s) 65, after "layers", insert --,--.
In Column 14, Line(s) 29, delete "hetero junction" and insert --heterojunction--, therefor.
In Column 17, Line(s) 56, after "100G", insert --,--.
In Column 25, Line(s) 28, delete "100" and insert --10C--, therefor.
In Column 27, Line(s) 9, after "example,", insert --an--.

Signed and Sealed this
Twenty-fifth Day of August, 2020

Andrei Iancu
*Director of the United States Patent and Trademark Office*

CERTIFICATE OF CORRECTION (continued)
U.S. Pat. No. 10,680,091 B2

In Column 28, Line(s) 15, delete "1000" and insert --100G--, therefor.
In Column 28, Line(s) 58, delete "100" and insert --10D--, therefor.
In Column 31, Line(s) 10, delete "drill" and insert --drift--, therefor.
In Column 33, Line(s) 8, delete "a an" and insert --a part--, therefor.
In Column 37, Line(s) 60, delete "100" and insert --10G--, therefor.
In Column 38, Line(s) 10, delete "10" and insert --10G,--, therefor.
In Column 38, Line(s) 18, delete "100" and insert --10G--, therefor.
In Column 38, Line(s) 23, delete "1014" and insert --10H--, therefor.
In Column 38, Line(s) 28, delete "100" and insert --10G--, therefor.
In Column 38, Line(s) 49, after "electron", delete ",".
In Column 40, Line(s) 8, delete "100" and insert --100S--, therefor.